(12) United States Patent
Iwasaki et al.

(10) Patent No.: US 7,723,915 B2
(45) Date of Patent: May 25, 2010

(54) ORGANIC LIGHT-EMITTING DEVICE AND DISPLAY APPARATUS

(75) Inventors: Yohei Iwasaki, Kawasaki (JP); Taiki Watanabe, Akishima (JP); Satoru Shiobara, Kawasaki (JP); Koichi Suzuki, Yokohama (JP); Kazunori Ueno, Glen Waverly (AU)

(73) Assignee: Canon Kabushiki Kaisha, Tokyo (JP)

( * ) Notice: Subject to any disclaimer, the term of this patent is extended or adjusted under 35 U.S.C. 154(b) by 11 days.

(21) Appl. No.: 12/205,485

(22) Filed: Sep. 5, 2008

(65) Prior Publication Data

US 2009/0082439 A1 Mar. 26, 2009

(30) Foreign Application Priority Data

Sep. 13, 2007 (JP) ............... 2007-238094

(51) Int. Cl.
H01J 1/62 (2006.01)
C09K 11/06 (2006.01)

(52) U.S. Cl. .................... 313/504; 428/690; 428/917; 313/498; 313/506

(58) Field of Classification Search ........... 313/504, 313/506, 498; 428/690, 917
See application file for complete search history.

(56) References Cited

U.S. PATENT DOCUMENTS

| 6,097,147 | A | 8/2000 | Baldo et al. ................ 313/506 |
| 6,303,231 | B1 | 10/2001 | Sawada et al. ............... 428/470 |
| 2006/0134425 | A1 | 6/2006 | Suzuki et al. ............ 428/411.1 |
| 2007/0257603 | A1 | 11/2007 | Suzuki et al. ............... 313/504 |
| 2007/0292716 | A1 | 12/2007 | Shiobara et al. ............. 428/690 |
| 2008/0309228 | A1 | 12/2008 | Watanabe et al. ........... 313/504 |

FOREIGN PATENT DOCUMENTS

| EP | 1 211 257 A1 | 6/2002 |
| JP | 200-033561 | 2/0000 |
| JP | 2001-033684 | 2/2001 |
| JP | 2001-189539 | 7/2001 |
| JP | 2001-219909 | 8/2001 |
| JP | 2001-239281 | 9/2001 |
| JP | 2001-247859 | 9/2001 |
| JP | 2001-248165 | 9/2001 |
| JP | 2001-298470 | 10/2001 |
| JP | 2002-173674 | 6/2002 |
| JP | 2002-203678 | 7/2002 |
| JP | 2002-203679 | 7/2002 |
| JP | 2002-226495 | 8/2002 |
| JP | 2002-234894 | 8/2002 |
| JP | 2003-231692 | 8/2003 |
| WO | WO 00/57676 | 9/2000 |
| WO | WO 00/70655 | 11/2000 |
| WO | WO 01/39234 A2 | 5/2001 |
| WO | WO 01/41512 A1 | 6/2001 |
| WO | WO 02/02714 A2 | 1/2002 |
| WO | WO 02/15645 A1 | 2/2002 |

OTHER PUBLICATIONS

Tamaki Nakano et al., "Synthesis, Structure, and Photophysical and Electrochemical Properties of a π-Stacked Polymer," Journal Of The American Chemical Society, 2003, pp. 15474-15484, vol. 125, No. 50.

Sergey Lamansky et al., "Highly Phosphorescent Bis-Cyclometalated Iridium Complexes: Synthesis, Photophysical Characterization, and Use in Organic Light Emitting Diodes," Journal Of The American Chemical Society, 2001, vol. 123, No. 18.

Akio Yamamoto, "Organotransition Metal Chemistry," Fundamental Concepts and Applications, 1986.

H. Yersin et al., Synthesis and Photophysical Studies of Ortho-Metalated Pd (II) Complexes Including Two Novel Pd(II)/Rh(III) Dimers, Photochemistry and Photophysics of Coordination Compounds, Proceedings of The Seventh International Symposium on the Photochemistry and Photophysics of Coordination Compounds Elmau/FRG, Mar. 29-Apr. 2, 1987, pp. 135-146.

H. Yersin et al., On The Orbital of the Luminescent Excited State of Orthometalated Transition Metal Complexes, Photochemistry and Photophysics of Coordination Compounds, Proceedings of The Seventh International Symposium on the Photochemistry and Photophysics of Coordination Compounds Elmau/FRG, Mar. 29-Apr. 2, 1987, pp. 71-77.

(Continued)

*Primary Examiner*—Charanjit S Aulakh
(74) *Attorney, Agent, or Firm*—Fitzpatrick, Cella, Harper & Scinto

(57) ABSTRACT

An organic light-emitting device adapted for coating and having good emission efficiency and luminance. The organic light-emitting device employs an anode, a cathode, and a layer including an organic compound sandwiched between the anode and cathode. The layer containing the organic compound includes a bisfluorene compound represented by General Formula [1] below.

[1]

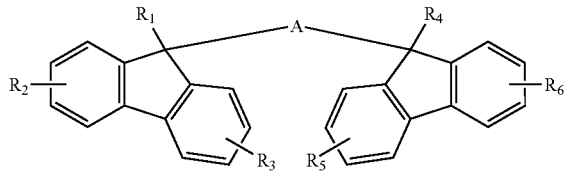

wherein in Formula [1], A is a substituted or unsubstituted alkylene group, a substituted or unsubstituted cycloalkylene group, a substituted silylene group, a substituted germylene group, an oxygen atom, and a sulfur atom.

6 Claims, 5 Drawing Sheets

OTHER PUBLICATIONS

M.A. Baldo et al., "Highly Efficient Phosphorescent Emission from Organic Electroluminescent Devices," Letter to Nature, Sep. 10, 1998, vol. 395, pp. 151-153.

M.A. Baldo et al., "Very High-Efficiency Green Organic Light-Emitting Devices Based on Electrophosphorescence," Applied Physics Letters, Jul. 5, 1999, vol. 75 No. 1.

Peter I. Djurovich et al., Ir(II) Cyclometalated Complexes as Efficient Phosphorescent Emitters in Polymer Blend and Organic LED's, Polymer Preprints, 2000, vol. 41, No. 1, pp. 770-771.

Chihaya Adachi et al., "Endothermic Energy Transfer: A Mechanism for Generating Very Efficient High-Energy Phosphorescent Emission in Organic Materials," Applied Physics Letters, Sep. 24, 2001, vol. 79, No. 13, pp. 2082-2084.

ORGANIC LIGHT-EMITTING DEVICE AND DISPLAY APPARATUS

BACKGROUND OF THE INVENTION

1. Field of the Invention

The present invention relates to an organic light-emitting device and a display apparatus.

2. Description of the Related Art

Organic light-emitting displays are known as one application of organic light-emitting devices. In order to realize an excellent organic light-emitting display that has a low power consumption, a high luminance, and a long service life, it is necessary to further improve the performance of materials constituting the organic light-emitting devices. On the other hand, a manufacturing method based on a coating process using a polymer material or the like enables cost reduction of organic light-emitting displays. A manufacturing method based on such a coating process is presently the main method for manufacturing organic light-emitting displays.

However, a problem associated with organic light-emitting devices using polymer materials is that the element operation life is shorter than that of low-molecular weight organic light-emitting devices. Polymer materials are typically synthesized by polymerizing a monomer of one kind or monomers of several kinds and the polymer materials obtained tend to have a broad molecular weight distribution and are therefore very difficult to manufacture accurately. This is the main factor affecting the device operation life.

Yet another problem is that the flatness and electronic properties of thin films of polymer materials vary significantly depending on the particular method selected employed for forming the films and the specific treatment conditions.

An attempt to improve the device operation life by using a dendrimer with a medium molecular weight that is disclosed in Japanese Patent Laid-open No. 2003-231692 represents a method for overcoming the drawbacks inherent to the above-described polymer materials. Further, an increase in emission efficiency can be attained by using a polyfluorene of a medium molecular weight (oligofluorene) in which the 2-position and the 7-position serve as connection positions.

Concerning oligofluorenes, a review of optical excitation of oligofluorene compounds of a π-stacking type connected to each other in 9-positions has been reported in J. Am. Chem. Soc., 125, 15474 (2003). However, organic light-emitting devices using bisfluorene compounds connected to each other at 9-positions have not yet been reported.

SUMMARY OF THE INVENTION

With the foregoing in view, the present invention provides an organic light-emitting device adapted for coating and having good emission efficiency and luminance.

Thus, the present invention provides an organic light-emitting device comprising an anode, a cathode, and a layer comprising an organic compound that is sandwiched between the anode and the cathode, wherein a bisfluorene compound represented by General Formula [1] below is present in the layer comprising the organic compound:

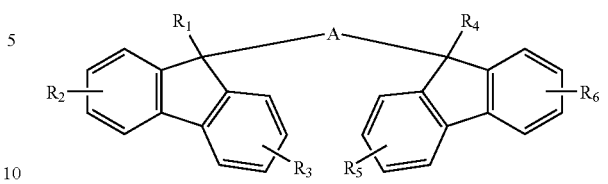

[1]

wherein in Formula [1], A is a substituted or unsubstituted alkylene group, a substituted or unsubstituted cycloalkylene group, a substituted silylene group, a substituted germylene group, an oxygen atom, and a sulfur atom. $R_1$ through $R_6$ are each a hydrogen atom, a substituted or unsubstituted alkyl group, a substituted or unsubstituted aralkyl group, a substituted or unsubstituted cycloalkyl group, a substituted or unsubstituted alkenyl group, a substituted or unsubstituted cycloalkenyl group, a substituted or unsubstituted alkoxy group, a substituted or unsubstituted aryl group, a substituted or unsubstituted aryloxy group, a substituted or unsubstituted condensed polycyclic aromatic group, a substituted or unsubstituted heterocyclic group, a substituted amino group, a substituted Silyl group, a substituted germyl group, or a halogen atom.

In accordance with the present invention, it is possible to provide an organic light-emitting device adapted for coating and having good emission efficiency and luminance.

Further features of the present invention will become apparent from the following description of exemplary embodiments with reference to the attached drawings.

DESCRIPTION OF THE EMBODIMENTS

The organic light-emitting device in accordance with the present invention will be described below in greater detail.

The organic light-emitting device in accordance with the present invention comprises an anode, a cathode, and a layer comprising an organic compound sandwiched between the anode and the cathode.

The organic light-emitting device in accordance with the present invention will be described below in greater detail with reference to the appended drawings.

Figure 1:
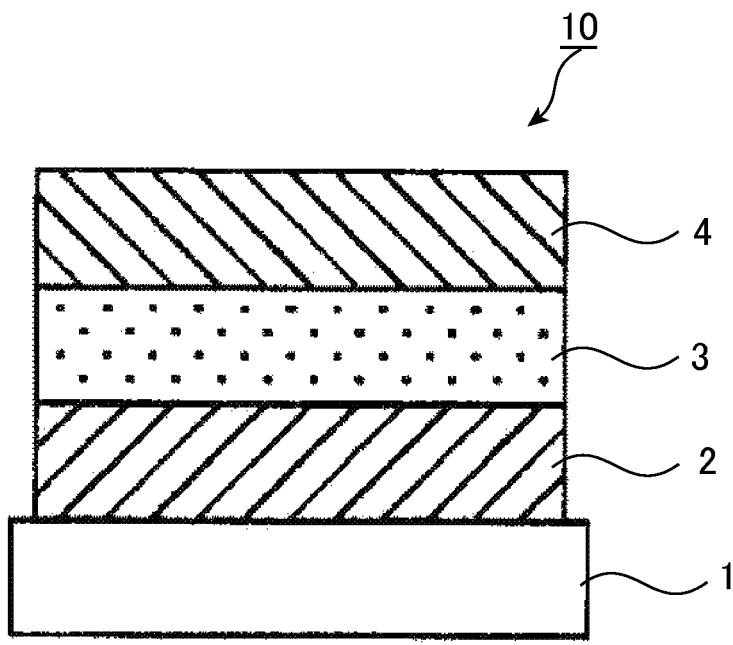
FIG. 1 is a cross-sectional view illustrating a first embodiment of the organic light-emitting device in accordance with the present invention.

FIG. 1 is a cross-sectional view illustrating a first embodiment of the organic light-emitting device in accordance with the present invention. In an organic light-emitting device 10 shown in FIG. 1, an anode 2, a light-emitting layer 3, and a cathode 4 are successively provided in the order of description on a substrate 1. The organic light-emitting device 10 shown in FIG. 1 is useful in the case where the light-emitting layer 3 has a hole transport ability, an electron transport ability, and also a light emission ability. The device also has good utility when it is configured by mixing organic compounds each having one characteristic selected form the hole transport ability, electron transport ability, and light emission ability.

Figure 2:
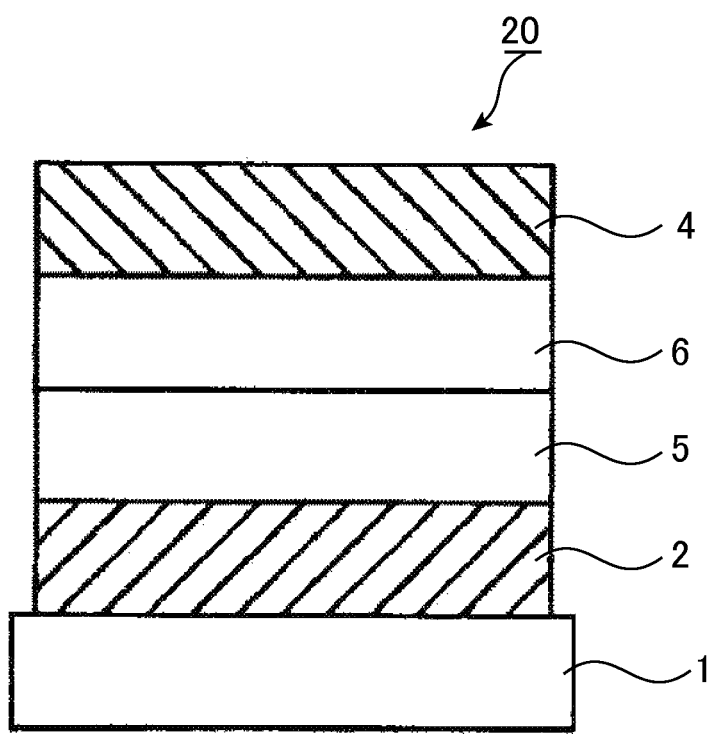
FIG. 2 is a cross-sectional view illustrating a second embodiment of the organic light-emitting device in accordance with the present invention.

FIG. 2 is a cross-sectional view illustrating a second embodiment of the organic light-emitting device in accordance with the present invention. In an organic light-emitting device 20 shown in FIG. 2, an anode 2, a hole transport layer 5, an electrode transport layer 6, and a cathode 4 are successively provided in the order of description on a substrate 1. The organic light-emitting device 20 shown in FIG. 2 is useful in the case where a light-emitting organic compound having either a hole transport ability or an electrode transport ability and an organic compound having only an electron transport ability or only a hole transport ability are used in combination. In the organic light-emitting device 20 shown in FIG. 2, either the hole transport layer 5 or the electron transport layer 6 also serves as a light-emitting layer.

Figure 3:
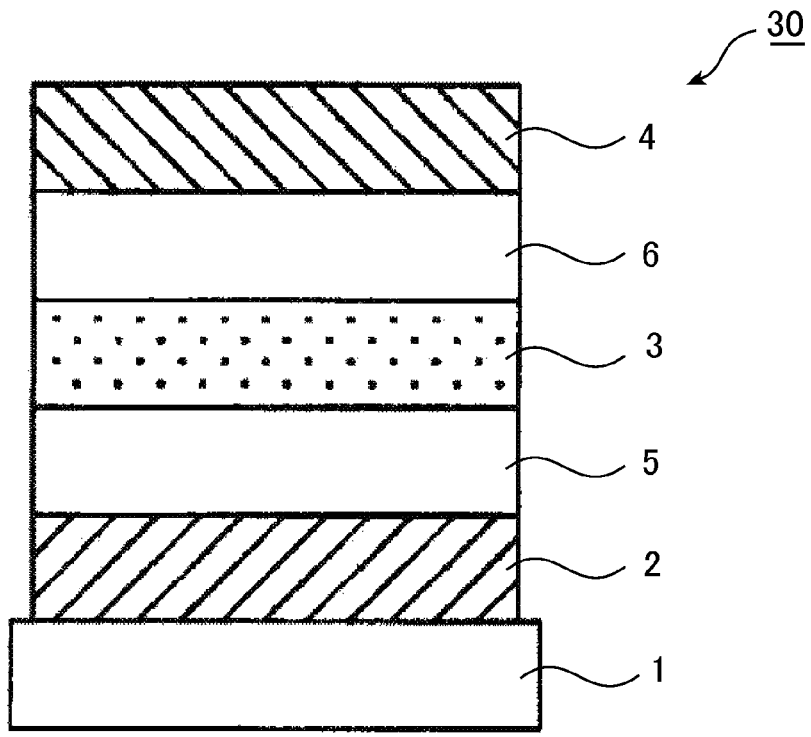
FIG. 3 is a cross-sectional view illustrating a third embodiment of the organic light-emitting device in accordance with the present invention.

FIG. 3 is a cross-sectional view illustrating a third embodiment of the organic light-emitting device in accordance with the present invention. An organic light-emitting device 30 shown in FIG. 3 has a configuration of the organic light-emitting device 20 shown in FIG. 2 in which a light-emitting layer 3 is provided between the hole transport layer 5 and electron transport layer 6. In the organic light-emitting device 30, the carrier transport function and light emission function are separated, and organic compounds having properties including a hole transport ability, an electron transport ability, and a light emission ability can be used in appropriate combinations. As a result, the degree of freedom in material selection is increased and various compounds that differ in a light emission wavelength can be used. Therefore, emission of increased variety of color tones can be produced. Furthermore, carriers or excitons can be effectively confined within the central light-emitting layer 3, and light emission efficiency of the organic light-emitting device 30 can be increased.

Figure 4:
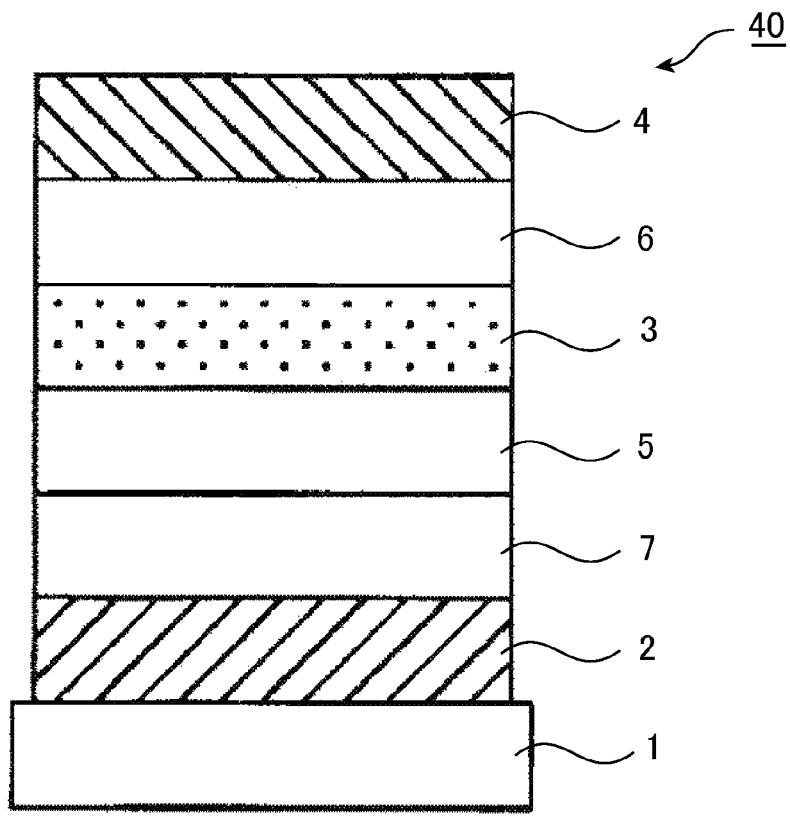
FIG. 4 is a cross-sectional view illustrating a fourth embodiment of the organic light-emitting device in accordance with the present invention.

FIG. 4 is a cross-sectional view illustrating a fourth embodiment of the organic light-emitting device in accordance with the present invention. An organic light-emitting device 40 shown in FIG. 4 has a configuration of the organic light-emitting device 30 shown in FIG. 3 in which a hole injection layer 7 is provided between the anode 2 and hole transport layer 5. In the organic light-emitting device 40 shown in FIG. 4, by providing the hole injection layer 7, it is possible to improve adhesion between the anode 2 and hole transport layer 5 or improve hole injection ability. Therefore, such a configuration is effective for decreasing a driving voltage.

Figure 5:
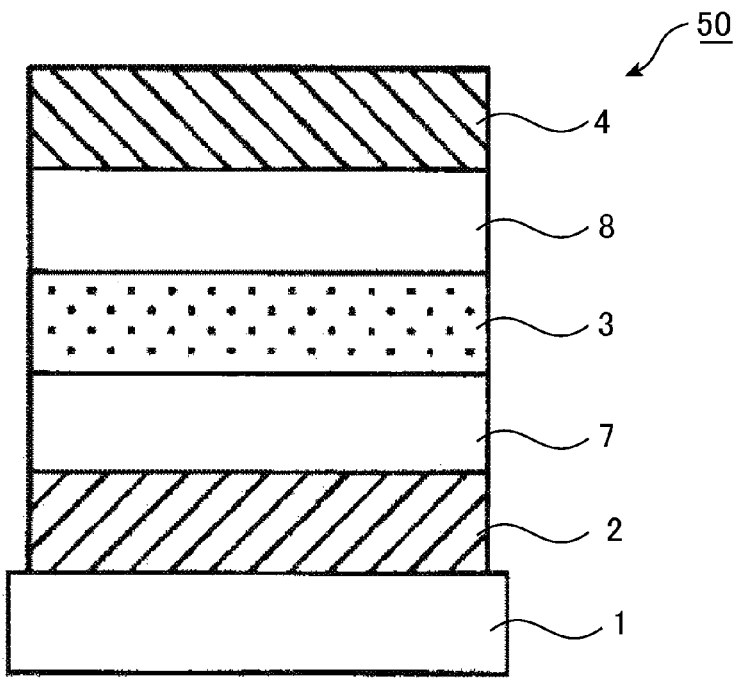
FIG. 5 is a cross-sectional view illustrating a fifth embodiment of the organic light-emitting device in accordance with the present invention.

FIG. 5 is a cross-sectional view illustrating a fifth embodiment of the organic light-emitting device in accordance with the present invention. In an organic light-emitting device 50 shown in FIG. 5, an anode 2, a hole injection layer 7, a light-emitting layer 3, an electron injection layer 8, and a cathode 4 are successively provided in the order of description on a substrate 1. In the organic light-emitting device 50 shown in FIG. 5, the hole transport layer 5 and electron transport layer 6 constituting the organic light-emitting device 30 shown in FIG. 3 are replaced with the hole injection layer 7 and electron injection layer 9, respectively. As a result, the hole and electron injection abilities are improved. Therefore, such a configuration is effective for decreasing a driving voltage.

Figure 6:
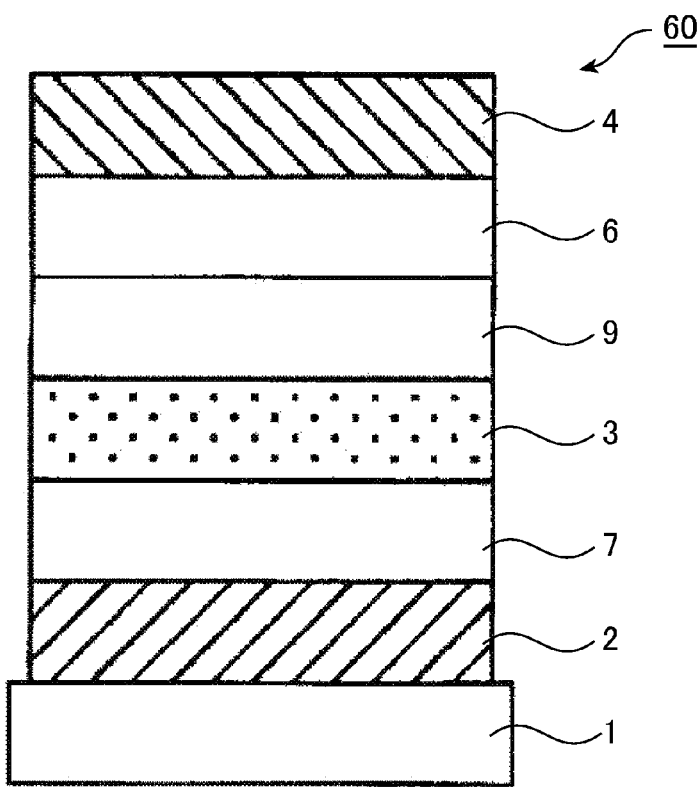
FIG. 6 is a cross-sectional view illustrating a sixth embodiment of the organic light-emitting device in accordance with the present invention.

FIG. 6 is a cross-sectional view illustrating a sixth embodiment of the organic light-emitting device in accordance with the present invention. An organic light-emitting device 60 shown in FIG. 6 has a configuration of the light-emitting device shown in FIG. 3 in which a layer (hole/exciton blocking layer 9) that prevents holes or excitons from breaking through to the cathode 4 is provided between the light-emitting layer 3 and electron transport layer 6. By using an organic compound with a very high ionization potential as the hole/exciton blocking layer 9, it is possible to increase emission efficiency.

FIG. 1 through FIG. 6 show very basic element configurations, and the configuration of the organic light-emitting device in accordance with the present invention is not limited thereto. Thus, a variety of layer configurations can be used, for example, an insulating layer, an adhesive layer, or an interference layer can be provided at the interfaces of electrodes and organic layer, or the hole transport layer can be composed of two layers with different ionization potentials.

In the organic light-emitting device in accordance with the present invention, at least one kind of a bisfluorene compound represented by General Formula [1] below is contained in the layer comprising the organic compound.

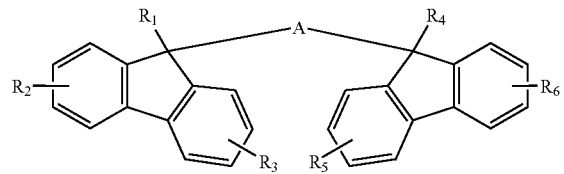

[1]

In Formula [1], A is a substituted or unsubstituted alkylene group, a substituted or unsubstituted cycloalkylene group, a substituted silylene group, a substituted germylene group, an oxygen atom, and a sulfur atom.

Examples of alkylene group represented by A include a $C_1$ to $C_6$ alkylene group, including a methylene group, an ethylene group, a propylene group, a butylene group, a pentylene group, and a hexylene group.

Examples of cycloalkylene group represented by A include a $C_3$ to $C_6$ cycloalkylene group, including a cyclopropylene group, a cyclobutylene group, a cyclopentylene group, and a cyclohexylene group.

Examples of silylene group represented by A include a diphenylsilylene group, a dimethylsilylene group, a diethylsilylene group, a ditrifluoromethylsilylene group, and a dipentafluoroethylsilylene group.

Examples of germylene group represented by A include a diphenylgermylene group, a dimethylgermylene group, a diethylgermylene group, a ditrifluoromethylgermylene group, and a dipentafluoroethylgermylene group.

Examples of substituents that may be present in the alkylene group and cycloalkylene group include an alkyl group such as a $C_1$ to $C_{12}$ alkyl group, including a methyl group, an ethyl group, an n-propyl group, an iso-propyl group, an n-butyl group, a tert-butyl group, a 2-methylbutyl group, a 4-methylpentyl group, a 2-ethylhexyl group, an octyl group, a 2-ethyloctyl group, and a dodecyl group, a fluorinated alkyl group such as a trifluoromethyl group and a pentafluoroethyl group, an aryl group such as a phenyl group, a 4-methylphenyl group, a biphenyl group, and a terphenyl group, and a halogen atom such as fluorine, chlorine, iodine, and bromine.

A is preferably an alkylene group or cycloalkylene group, and more preferably a methylene group.

In Formula [1], $R_1$ through $R_6$ are each a hydrogen atom, a substituted or unsubstituted alkyl group, a substituted or unsubstituted aralkyl group, a substituted or unsubstituted cycloalkyl group, a substituted or unsubstituted alkenyl group, a substituted or unsubstituted cycloalkenyl group, a substituted or unsubstituted alkoxy group, a substituted or unsubstituted aryl group, a substituted or unsubstituted condensed polycyclic aromatic group, a substituted or unsubstituted heterocyclic group, a substituted or unsubstituted aryloxy group, a substituted amino group, a substituted silyl group, a substituted germyl group, or a halogen atom.

Examples of alkyl groups represented by $R_1$ through $R_6$ include a methyl group, a trifluoromethyl group, an ethyl group, an n-propyl group, an iso-propyl group, a tert-butyl group, an octyl group, a 2-ethyloctyl group, and a decyl group.

Examples of aralkyl groups represented by $R_1$ through $R_6$ include a benzyl group and a phenethyl group.

Examples of cycloalkyl group represented by $R_1$ through $R_6$ include a cyclopentyl group, a cyclohexyl group, a cyclooctyl group, an adamantyl group, and a methylcyclohexyl group.

Examples of alkenyl groups represented by $R_1$ through $R_6$ include a vinyl group, an allyl (2-propenyl) group, a 1-propenyl group, an iso-propenyl group, and a 2-butenyl group.

Examples of cycloalkenyl groups represented by $R_1$ through $R_6$ include a cyclopentenyl group, a cyclohexenyl group, a cyclohexedienyl group, and a cyclooctenyl group.

Examples of alkoxy groups represented by $R_1$ through $R_6$ include a methoxy group, an ethoxy group, a propoxy group, a 2-ethyloctyloxy group, and a benzyloxy group.

Examples of aryl groups represented by $R_1$ through $R_6$ include a phenyl group, a biphenyl group, and a terphenyl group.

Examples of condensed polycyclic aromatic groups represented by $R_1$ through $R_6$ include a naphthyl group a phenantolyl group, an anthranyl group, a pyrenyl group, a fluorenyl group, and a fluoranthenyl group.

Examples of heterocyclic groups represented by $R_1$ through $R_6$ include a pyridyl group, a bipyridyl group, a methylpyridyl group, a thienyl group, a terthienyl group, a propylthienyl group, a furyl group, a quinolyl group, a carbazolyl group, and an N-ethylcarbazolyl group.

Examples of aryloxy groups represented by $R_1$ through $R_6$ include a phenoxy group and a 4-butylphenoxy group.

Examples of substituted amino groups represented by $R_1$ through $R_6$ include a methylamino group, an ethylamino group, a dimethylamino group, a diethylamino group, a methylethylamino group, a benzylamino group, a methylbenzylamino group, an anilino group, a diphenylamino group a phenyltolylamino group, a ditolylamino group and a di-(tert-butylphenyl)amino group.

Examples of substituted silyl groups represented by $R_1$ through $R_6$ include a trimethylsilyl group, a triethylsilyl group, and a triphenylsilyl group.

Examples of substituted germyl groups represented by $R_1$ through $R_6$ include a trimethylgermyl group, a triethylgermyl group, and a triphenylgermyl group.

Examples of halogen atoms represented by $R_1$ through $R_6$ include fluorine, chlorine, bromine, and iodine.

Examples of substituents that may be present in the above-described alkyl group, aralkyl group, cycloalkyl group, alkenyl group, cycloalkenyl group, alkoxy group, aryl group, heterocyclic group, condensed polycyclic aromatic groups, and aryloxy groups include alkyl groups such as a methyl group an ethyl group, an n-propyl group, an iso-propyl group, an n-butyl group, a tert-butyl group, a 2-methylbutyl group, a 4-methylpentyl group, a 2-ethylhexyl group, an octyl group, a 2-ethyloctyl group, and a dodecyl group, fluorinated alkyl groups such as a trifluoromethyl group and a pentafluoroethyl group, aralkyl groups such as a benzyl group, and a phenethyl group, cycloalkyl groups such as a cyclopentyl group, a cyclohexyl group, a cyclooctyl group, an adamantyl group, and a methylcyclohexyl group, alkenyl groups such as a vinyl group an allyl group (2-propenyl group), a 1-propenyl group, an iso-propenyl group, and a 2-butenyl group, cycloalkenyl groups such as a cyclopentenyl group, a cyclohexenyl group, a cyclohexedienyl group, and a cyclooctenyl group, alkoxy groups such as a methoxy group, an ethoxy group, a propoxy group, a 2-ethyloctyloxy group, and a benzyloxy group, aryl groups such as a phenyl group, a biphenyl group, and a terphenyl group, condensed polycyclic aromatic rings such as a naphthyl group, a phenantolyl group, an anthranyl group, a pyrenyl group, a fluorenyl group, and a fluoranthenyl group, heterocyclic groups such as a pyridyl group, a bipyridyl group, a methylpyridyl group, a thienyl group, a terthienyl group, a propylthienyl group, a furyl group, a quinolyl group, a carbazolyl group, and an N-ethylcarbazolyl group, aryloxy groups such as a phenoxy group and a 4-butylphenoxy group, substituted amino groups such as a methylamino group, an ethylamino group, a dimethylamino group, a diethylamino group, a methylethylamino group, a benzylamino group, a methylbenzylamino group, an anilino group, a diphenylamino group, a phenyltolylamino group, and a ditolylamino group, substituted silyl groups such as a trimethylsilyl group, a triethylsilyl group, and a triphenylsilyl group, substituted germyl groups such as a trimethylgermyl group, a triethylgermyl group, and a triphenylgermyl group, and halogen atoms such as fluorine, chlorine, bromine, and iodine, but it goes without saying that this list is not limiting.

The bisfluorene compound represented by Formula [1] is preferably a compound represented by Formula [2] below.

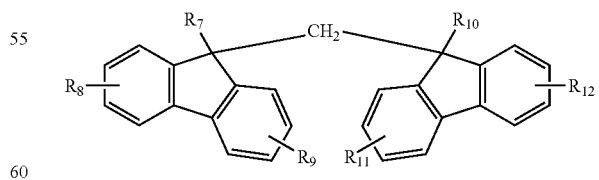

[2]

In Formula [2], $R_7$ through $R_{12}$ are each a hydrogen atom, a substituted or unsubstituted alkyl group, a substituted or unsubstituted aralkyl group, a substituted or unsubstituted cycloalkyl group, a substituted or unsubstituted alkenyl group, a substituted or unsubstituted cycloalkenyl group, a substituted or unsubstituted alkoxy group, a substituted or unsubstituted aryl group, a substituted or unsubstituted condensed polycyclic aromatic group, a substituted or unsubstituted heterocyclic group, a substituted or unsubstituted aryloxy group, a substituted amino group, a substituted silyl group, a substituted germyl group, or a halogen atom.

Specific examples of the alkyl group, aralkyl group, cycloalkyl group, alkenyl group, cycloalkenyl group, alkoxy group, aryl group, condensed polycyclic aromatic group, heterocyclic group, aryloxy group, substituted amino group, substituted silyl group, substituted germyl group, and halogen atom represented by $R_7$ through $R_{12}$ are identical to those represented by $R_1$ through $R_6$. Specific examples of substituents that may be present in the aforementioned alkyl group, aralkyl group, cycloalkyl group, alkenyl group, cycloalkenyl group, alkoxy group, aryl group, condensed polycyclic aromatic group, heterocyclic group, and aryloxy group are also identical to those relating to $R_1$ through $R_6$.

Where the bisfluorene compound represented by Formula [1] or [2] is sublimable, vapor deposition is possible. Therefore, a process for manufacturing the organic light-emitting device in accordance with the present invention is not limited to either the vapor deposition process or a coating process. When the organic light-emitting device in accordance with the present invention is manufactured by a coating process, it can be solvated by dissolving it in an appropriate organic solvent. When the bisfluorene compound represented by Formula [1] or [2] does not have sufficient solubility in a specific organic solvent, a substituent for increasing solubility, for example, an alkyl group or a trifluoromethyl group, may be introduced in the compound skeleton.

Specific examples of the bisfluorene compound represented by Formula [1] or [2] are presented below, but it goes without saying that the present invention is not limited to these compounds.

No. 101

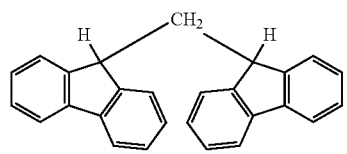

No. 102

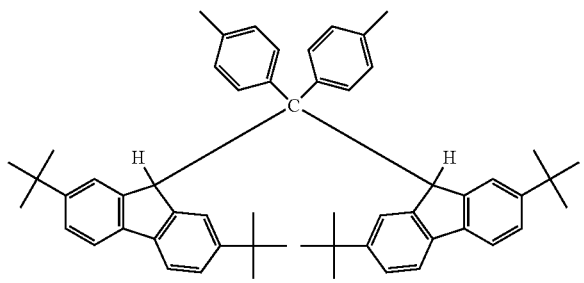

No. 103

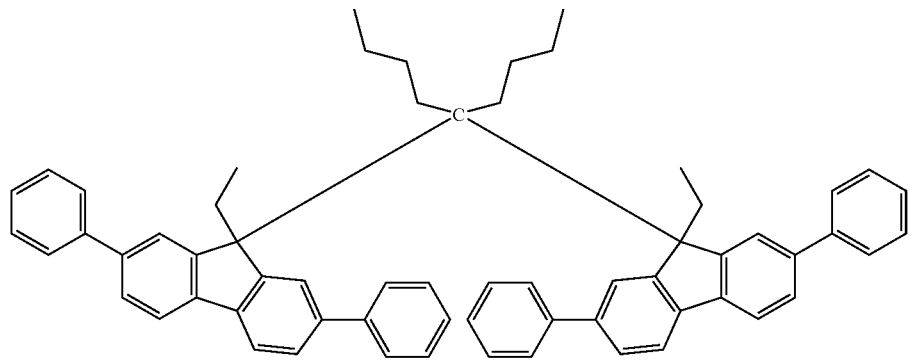

No. 104

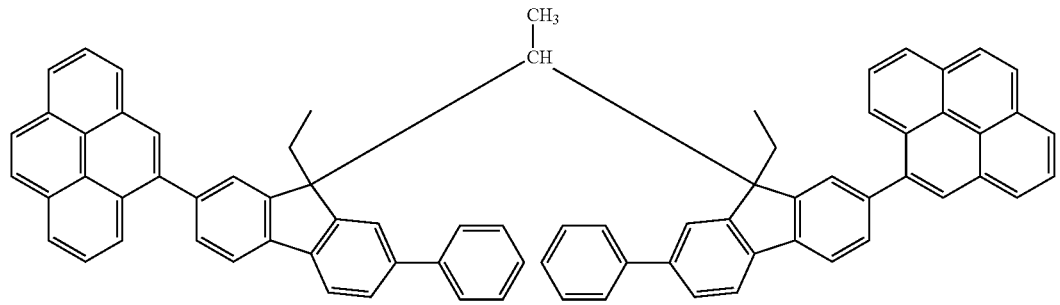

-continued
No. 105
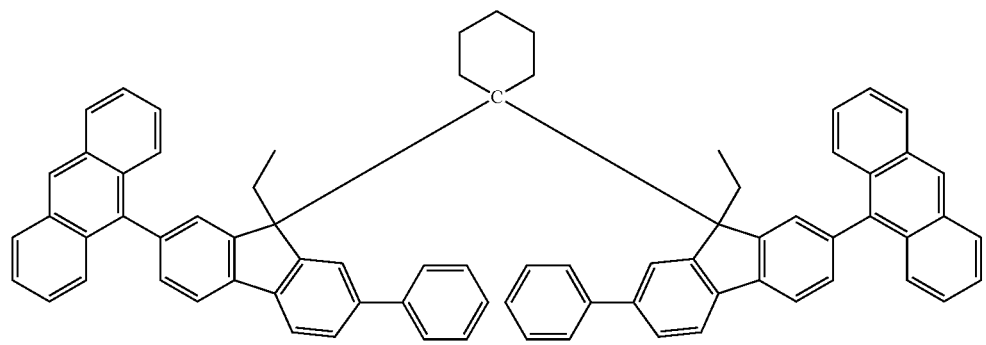
No. 106
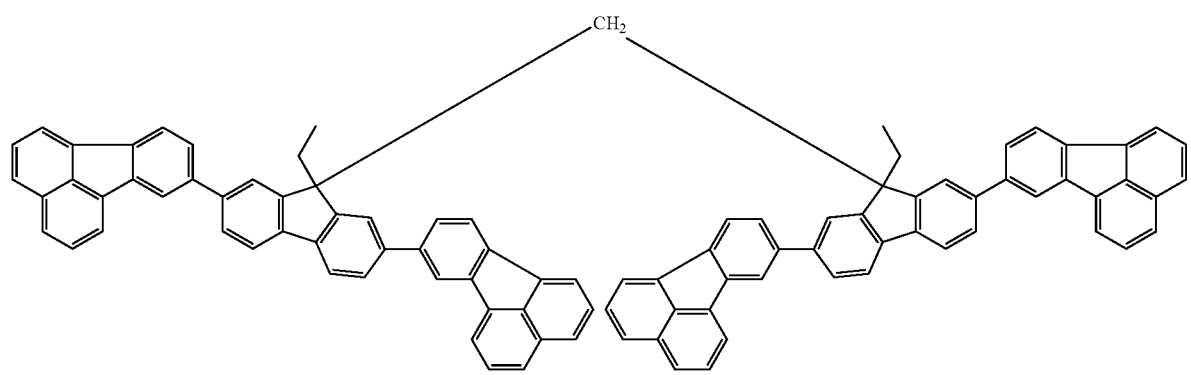
No. 107
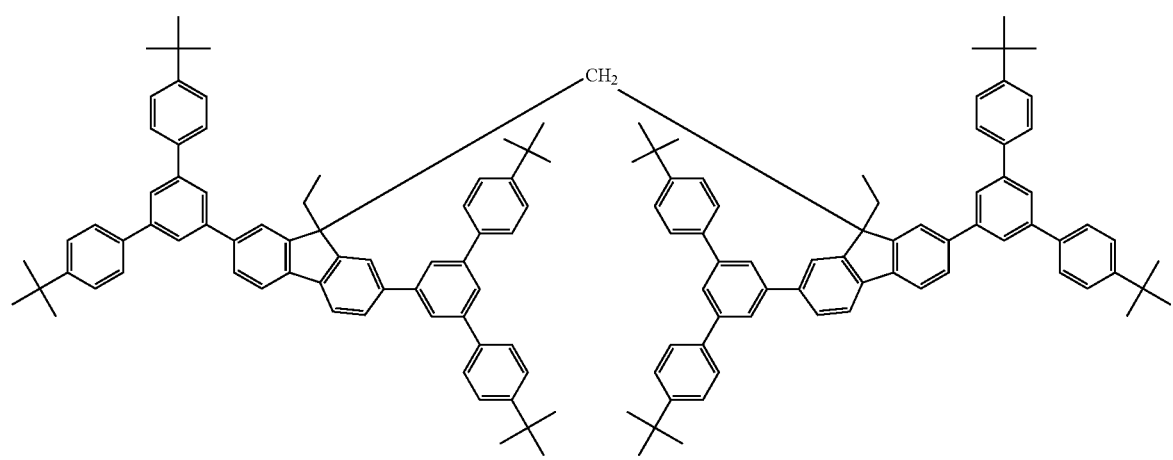

-continued
No. 108
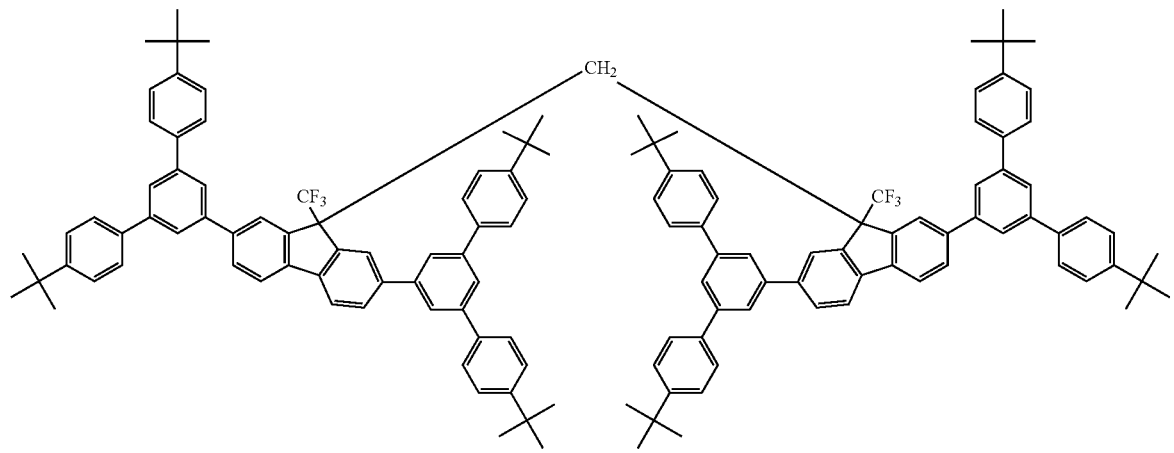
No. 109
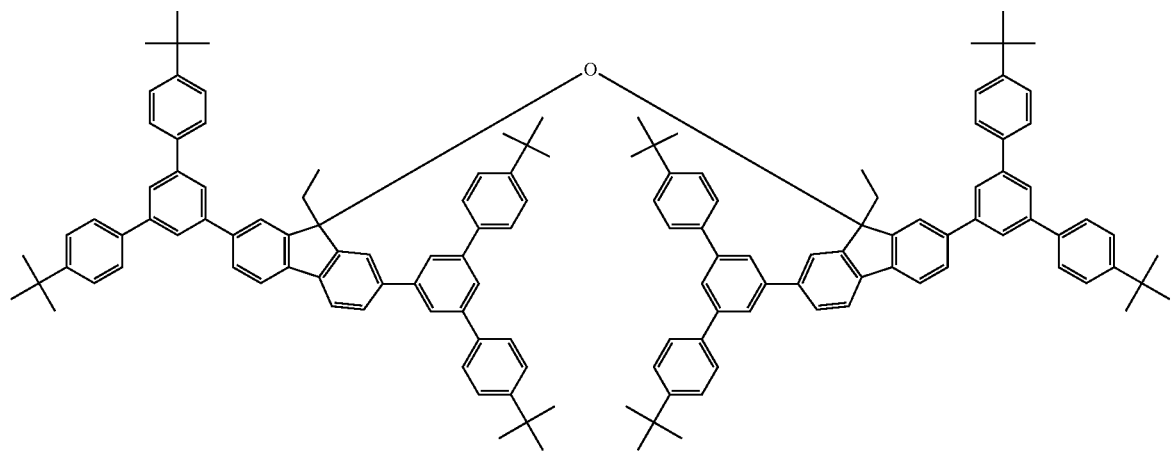
No. 110
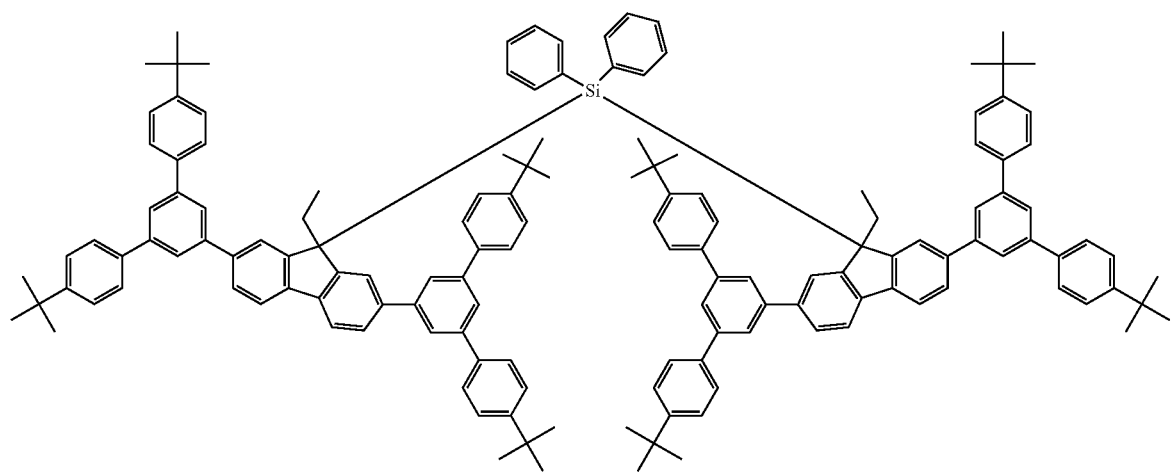

-continued
No. 111
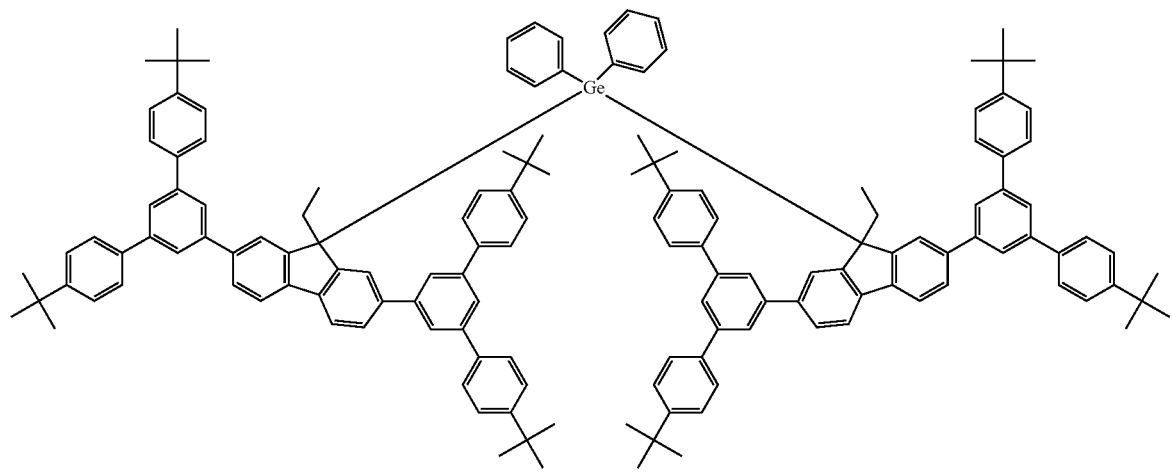
No. 112
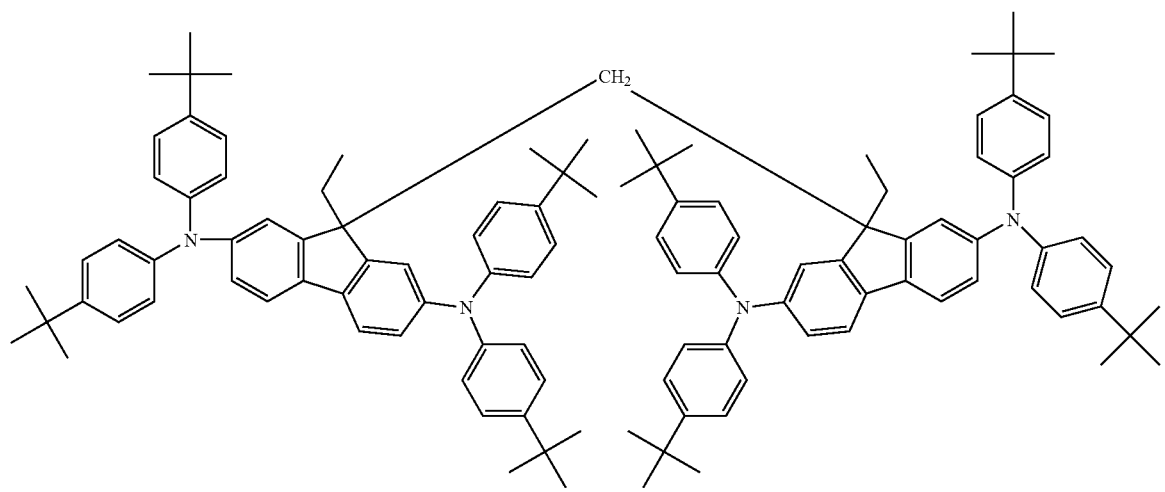
No. 113
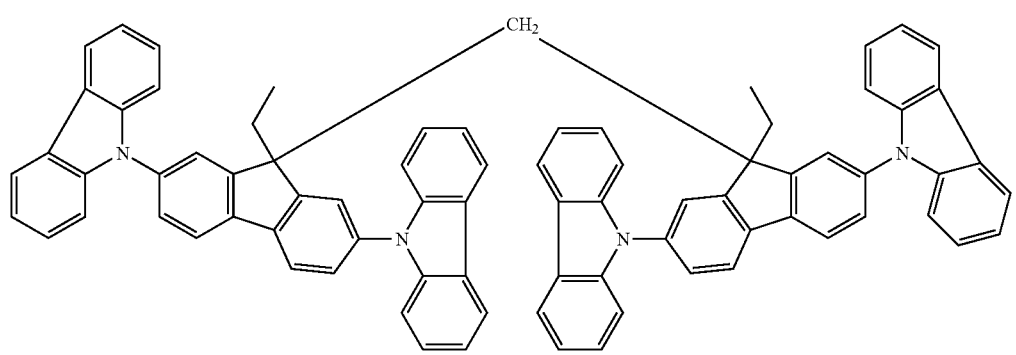

-continued
No. 114
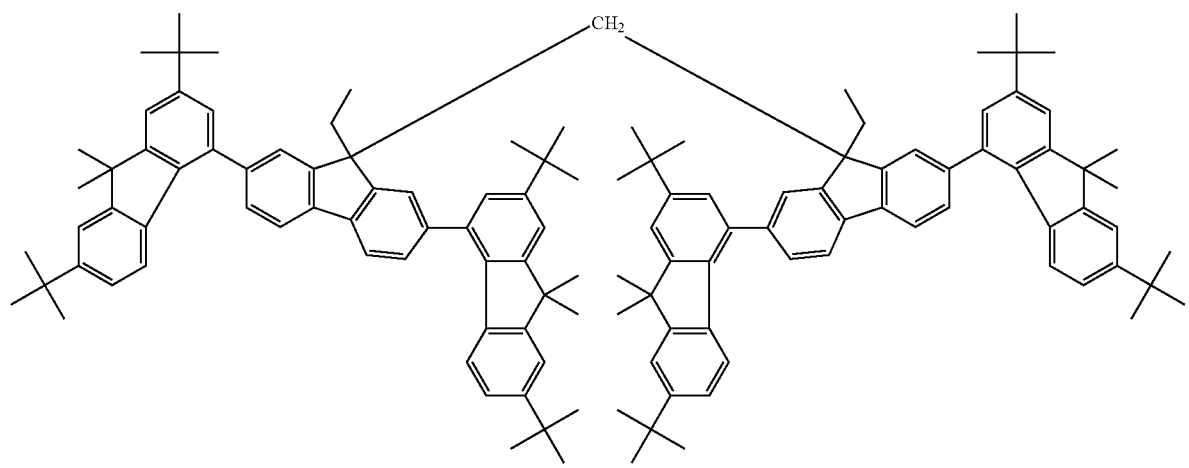
No. 115
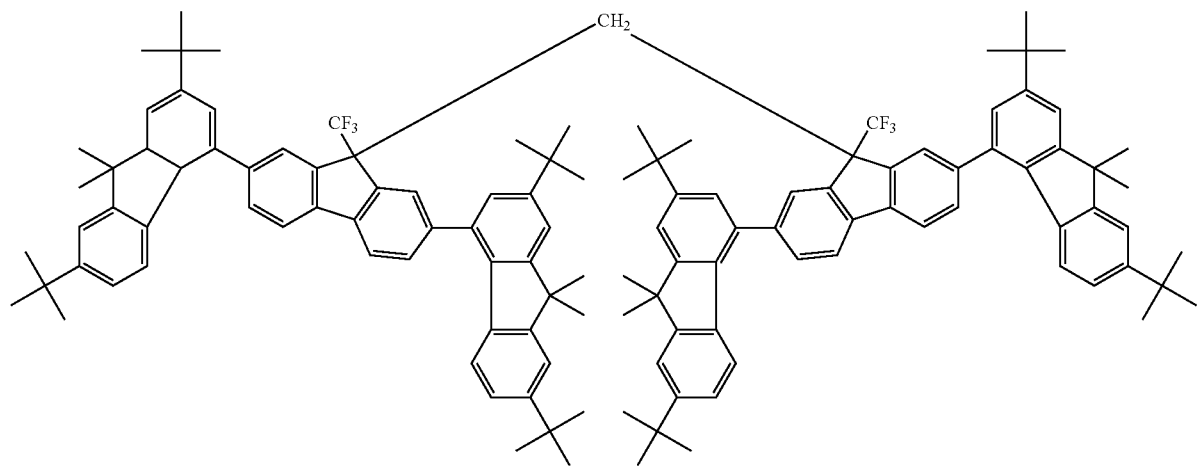
No. 116
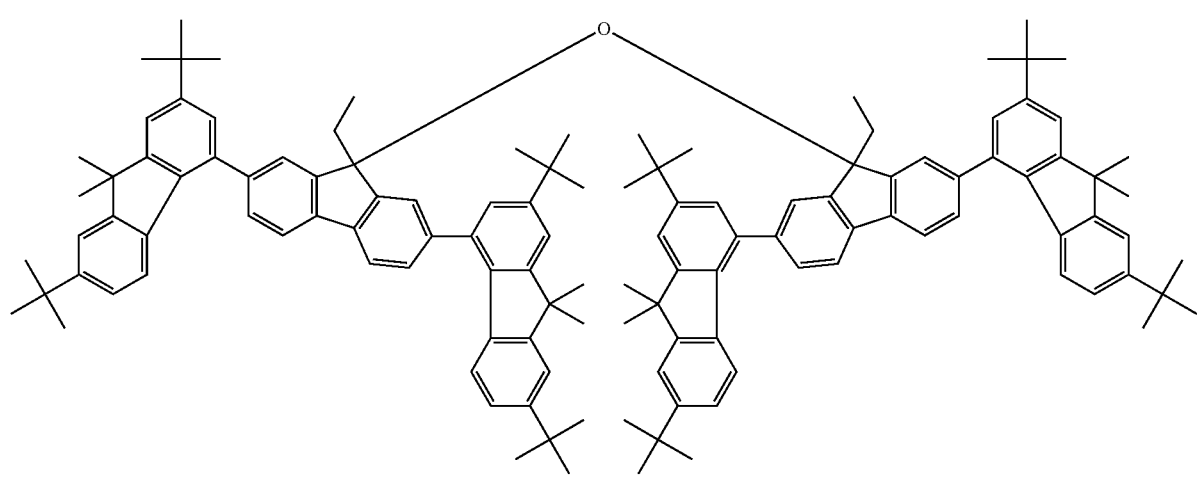

No. 117
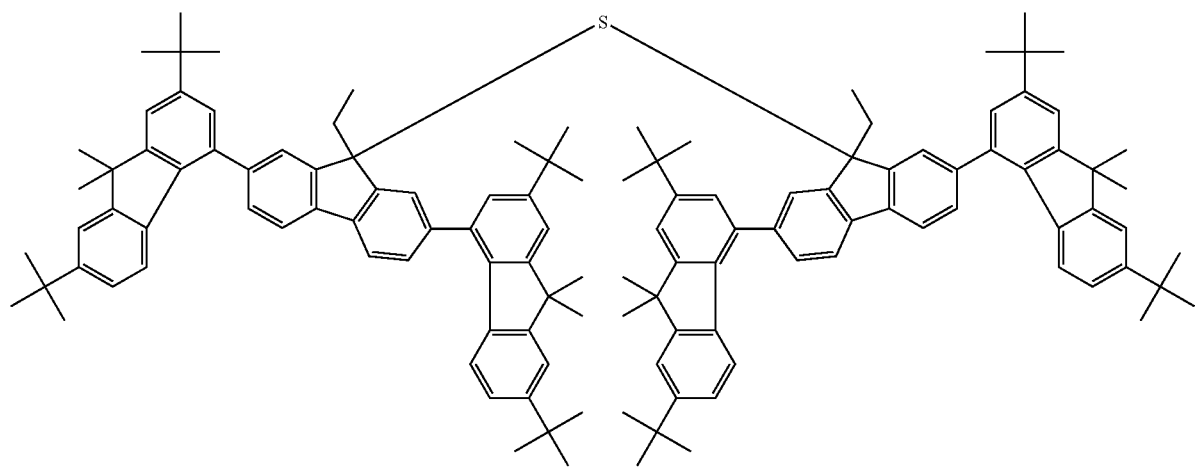
No. 118
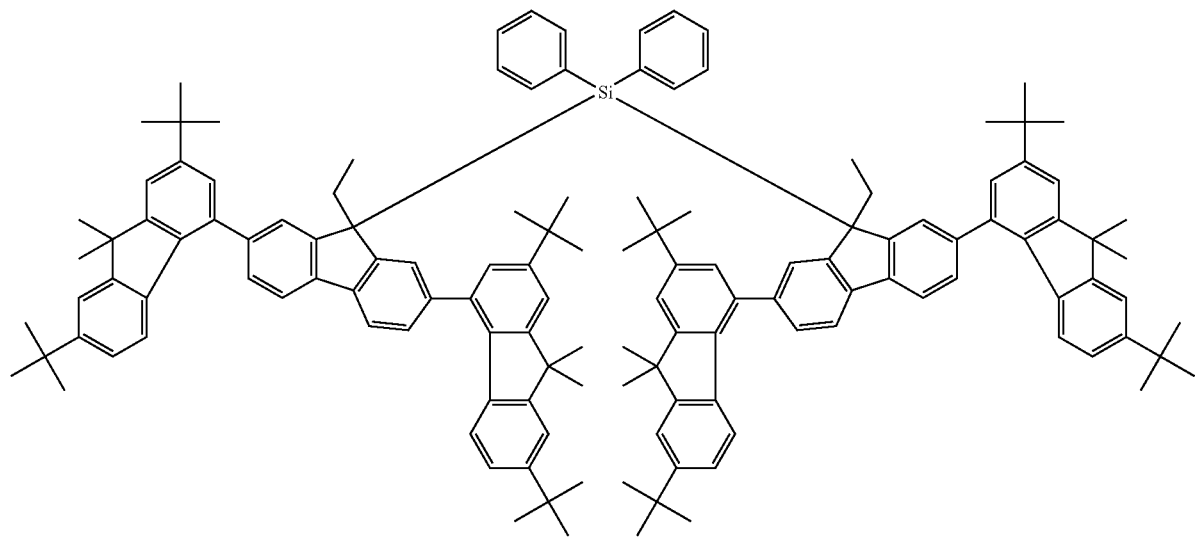
No. 119
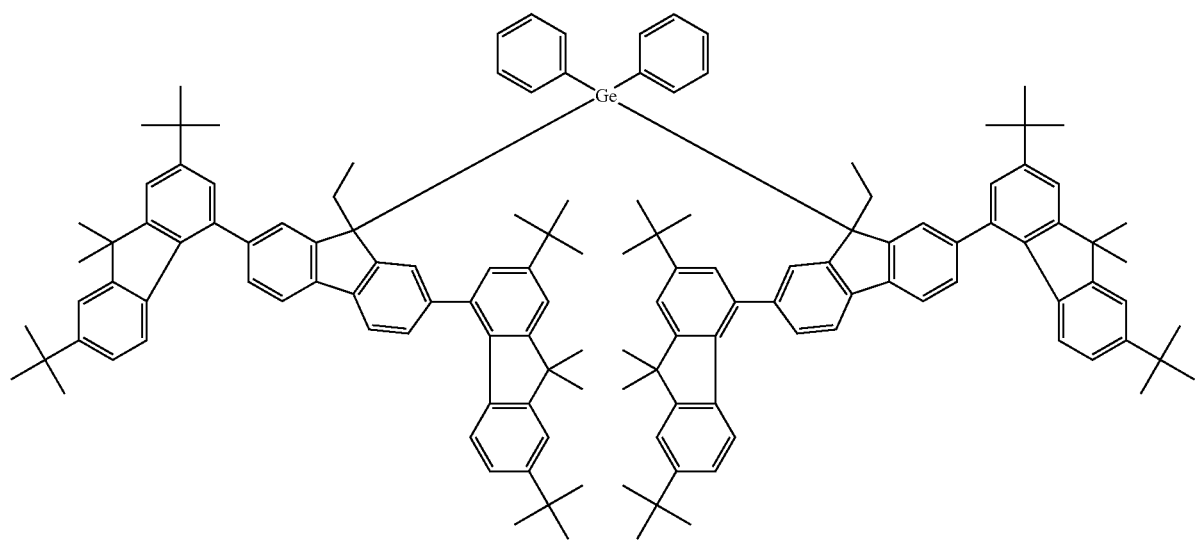

-continued
No. 120
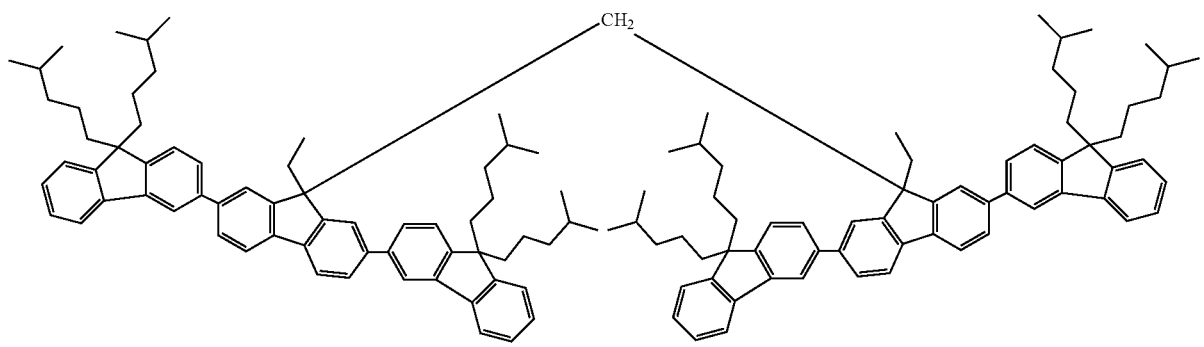
No. 121
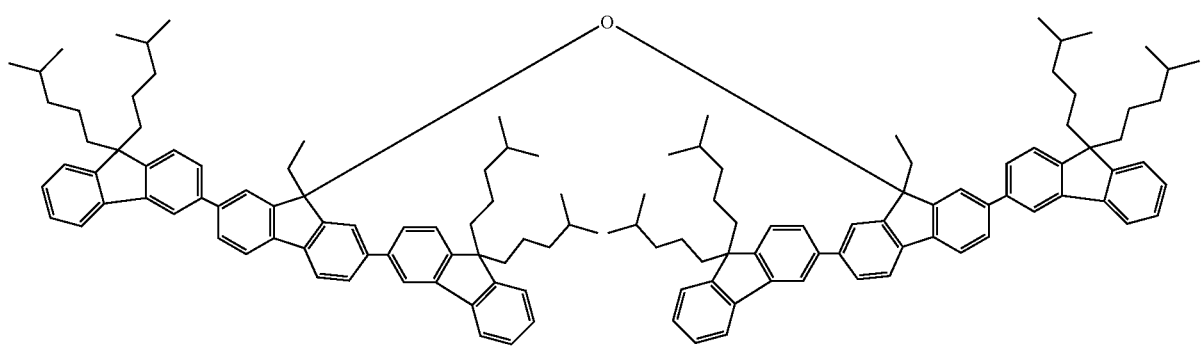
No. 122
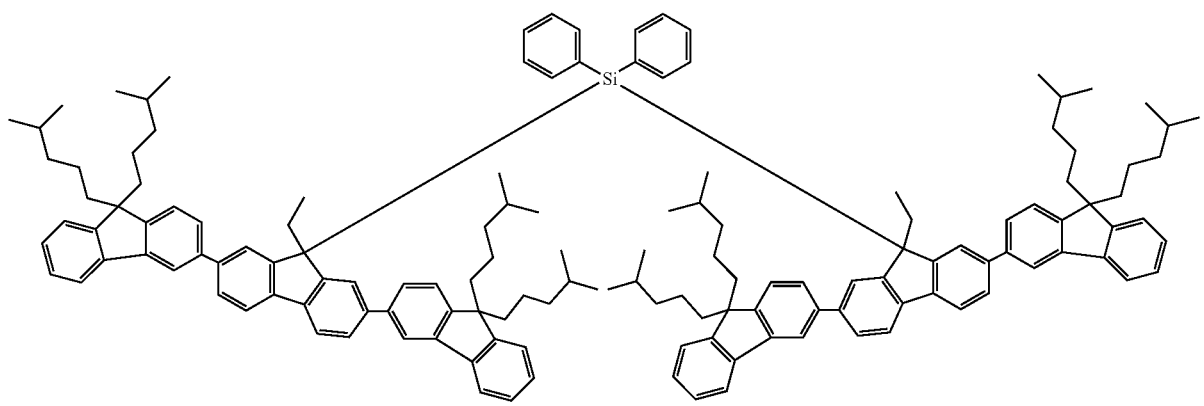
No. 123
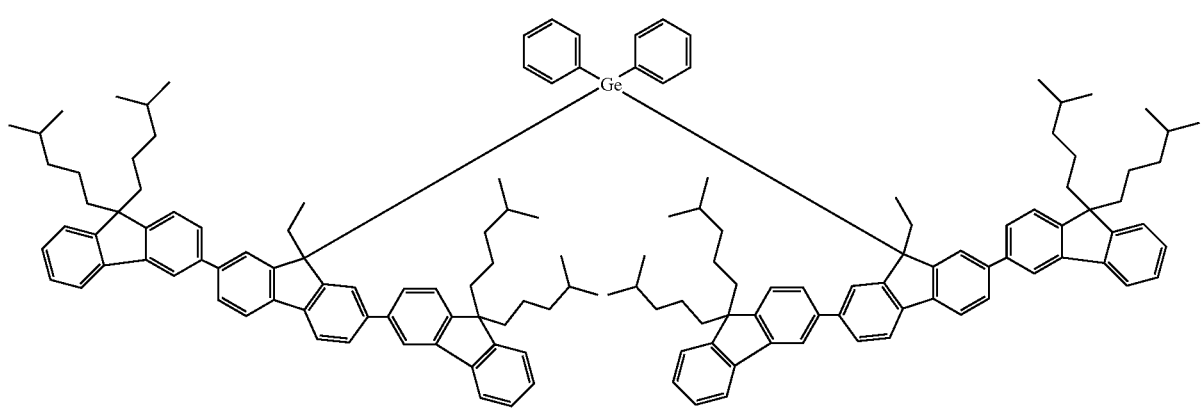

-continued
No. 124
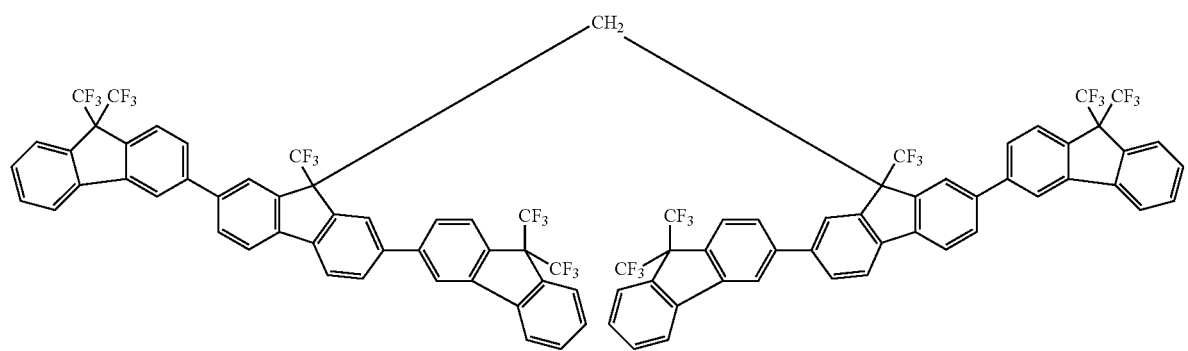
No. 125
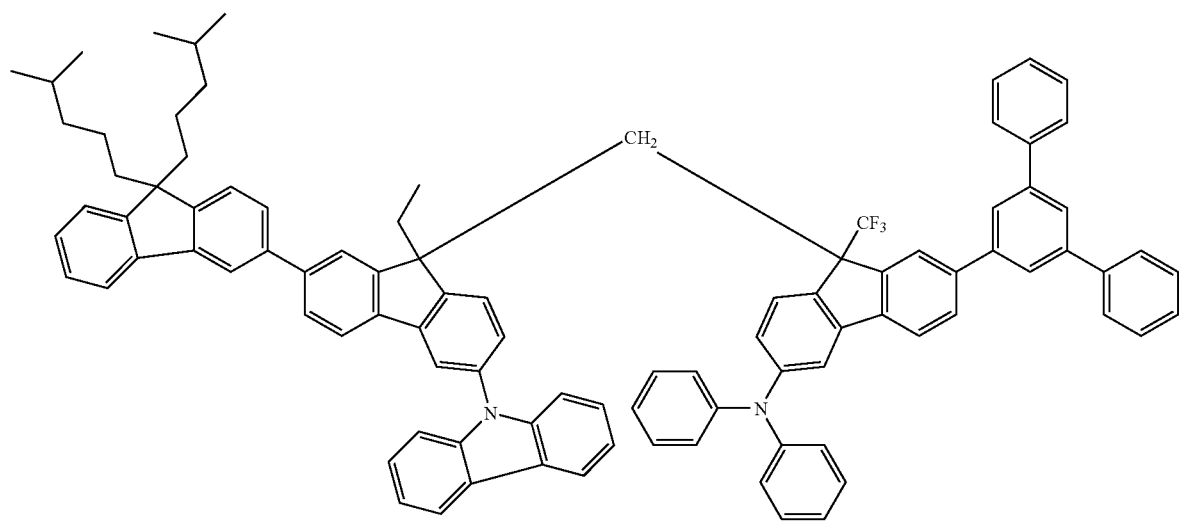
No. 126
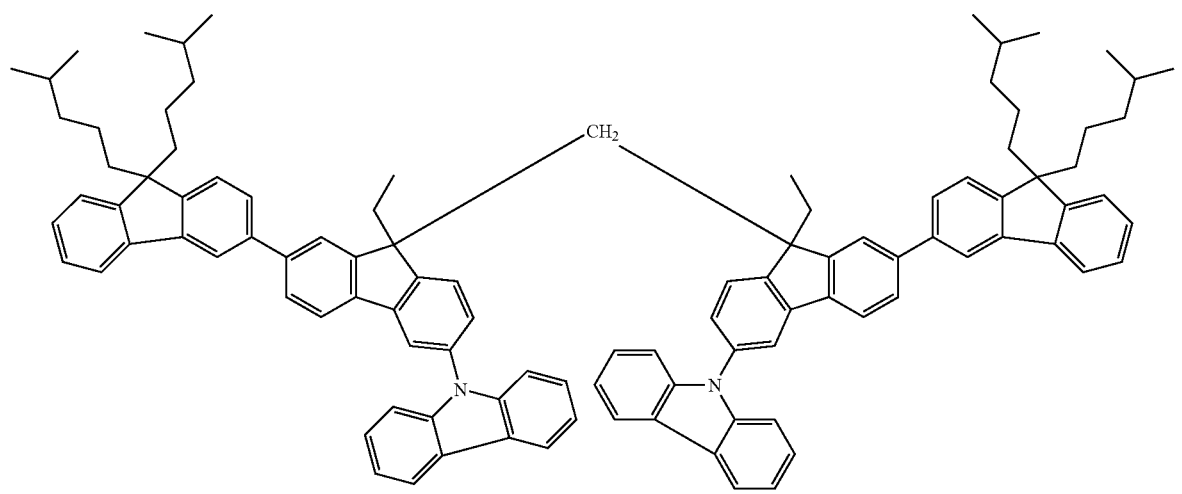

-continued

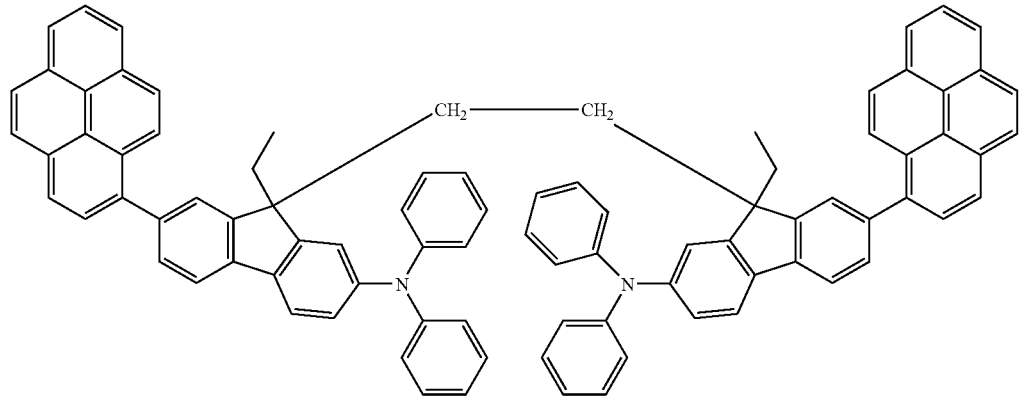

No. 127

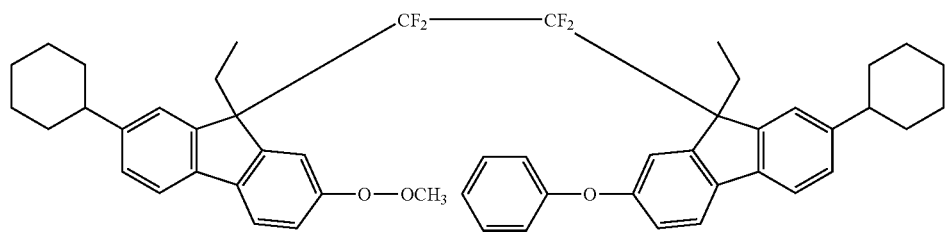

No. 128

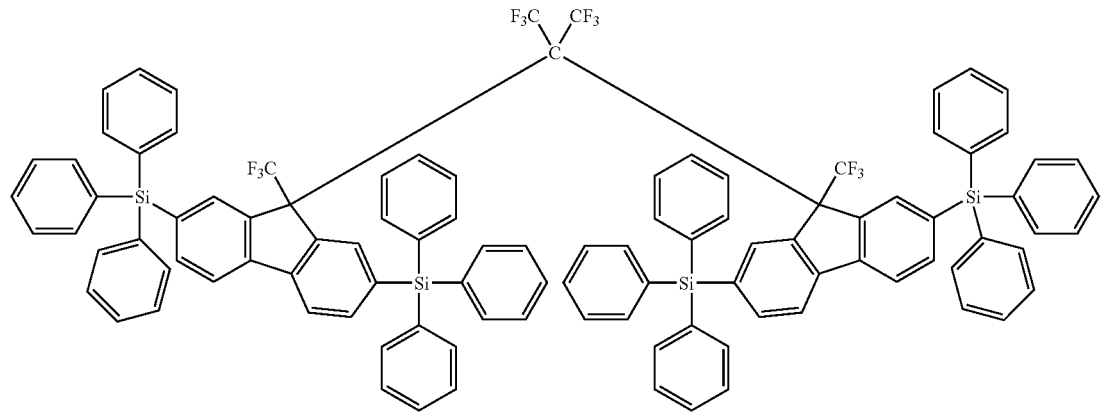

No. 129

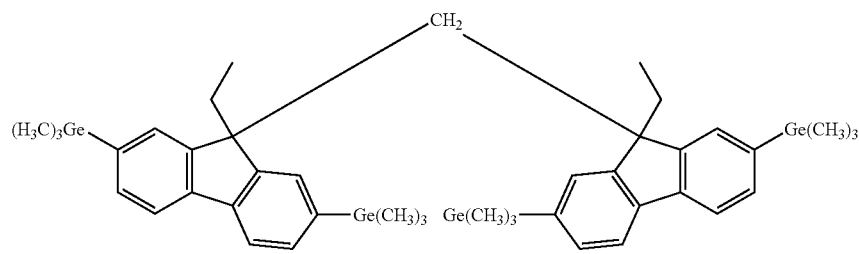

No. 130

As described above, the organic light-emitting device in accordance with the present invention comprises at least one kind of a bisfluorene compound represented by Formula [1] or [2] in a layer comprising an organic compound. The layer comprising an organic compound as referred to herein is specifically the light-emitting layer 3, hole transport layer 5, electron transport layer 6, hole injection layer 7, electron injection layer 8, and hole/exciton blocking layer 9. The bisfluorene compound represented by Formula [1] or [2] is preferably contained in the light-emitting layer 3. The bisfluorene compound may be contained only in one layer or in a plurality of layers.

The light-emitting layer may be composed only of the bisfluorene compound represented by Formula [1] or [2], but it may also include a host and a guest. It is preferred that the light-emitting layer 3 contain the bisfluorene compound represented by Formula [1] or [2] as a host and a fluorescent compound or a phosphorescent compound of at least one kind as a guest.

Specific examples of a fluorescent compound serving as a guest include benzoxazole and derivatives thereof, benzimidazole and derivatives thereof, benzothiazole and derivatives thereof, styrylbenzene and derivatives thereof, polyphenyl and derivatives thereof, diphenylbutadiene and derivatives thereof, tetraphenylbutadiene and derivatives thereof, naphthalimide and derivatives thereof, coumarin and derivatives thereof, condensed aromatic compounds, perynone and derivatives thereof, oxadiazole and derivatives thereof, oxazine and derivatives thereof, aldazine and derivatives thereof, pyralidine and derivatives thereof, cyclopentadiene and derivatives thereof, bisstyrylanthracene and derivatives thereof, quinacridone and derivatives thereof, pyrrolopyridine and derivatives thereof, thiadiazolopyridine and derivatives thereof, cyclopentadiene and derivatives thereof, styrylamine and derivatives thereof, diketopyrrolopyrrole and derivatives thereof, aromatic dimethylidyne compounds, various metal complexes represented by metal complexes containing any of 8-quinolinol and derivatives thereof as a ligand, metal complexes containing any of pyrromethene and derivatives thereof as a ligand, rare earth element complexes, and transition metal complexes, polymer compounds such as polythiophene, polyphenylene, and polyphenylenevinylene, and organic silanes and derivatives thereof.

A transition metal complex is preferred as a phosphorescence compound serving as a guest. The central metal of the transition metal complex is not particularly limited, but is preferably iridium, platinum, rhenium, or ruthenium, more preferably iridium or platinum, and most preferably iridium. More specifically, orthometalated complexes described in the following reference sources can be used.

1. Akio Yamamoto: "Yuki Kinzoku, Kiso to Oyo", p. 150 and p. 232, published by Shokabo Sha (1982).
2. H. Yersin: "Photochemistry and Photophysics of Coordination Compounds, pp. 71 to 77 and pp. 135 to 146, published by Springer-Verlag (1987).
3. The Japan Society for Promotion of Science. Committee No. 142, Organic Materials for Information Science, Section C (Organic Electronics), Daikyu Kenkyukai, pp. 25 to 32 (2005).

In addition to the compounds described in the aforementioned reference sources, phosphorescent light-emitting materials described in the following patent documents can be advantageously used: U.S. Pat. Nos. 6,303,231, 6,097,147, International Patents WO 00/57676, WO 0070655, WO 01/08230, WO 01/39234, WO 01/41512, WO 02/02714, and WO 02/15645, Japanese Patent Applications Laid-open No. 2001-247859, 2000-33561, 2001-189539, 2001-248165, 2001-33684, 2001-239281, and 2001-219909, European Patent No. 1211257, Japanese Patent Applications Laid-open No. 2002-226495, 2002-234894, 2001-247859, 2001-298470, 2002-173674, 2002-203678, and 2002-203679.

Phosphorescent light-emitting materials described in the following non-patent documents can be also advantageously used: Nature, vol. 395, p. 151 (1998), Applied Physics Letters, vol. 75, page 4 (1999), Polymer Preprints, vol. 41, p. 770 (2000), Journal of American Chemical Society, vol. 123, p. 4304 (2001), and Applied Physics Letters, vol. 79, p. 2082 (1999).

The content of the bisfluorene compound represented by Formula [1] or [2] that is a host compound is 1 wt. % to 100 wt. % based on the total weight of the material constituting the light-emitting layer 3.

The organic light-emitting device in accordance with the present invention thus uses a bisfluorene compound represented by Formula [1] or [2], in particular, as a constituent material of a light-emitting layer. In addition to the bisfluorene compound represented by Formula [1] or [2], the organic light-emitting device in accordance with the present invention can also use, if necessary, a combination of a compound having a hole transport ability and a compound having an electron transport ability that are well known.

Specific examples of compounds having a hole transport ability include triarylamine derivatives, phenylenediamine derivatives, triazole derivatives, oxadiazole derivatives, imidazole derivatives, pyrazoline derivatives, pyralozone derivatives, oxazole derivatives, fluorenone derivatives, polyvinylcarbazole, polysilylene, and polythiophene.

Specific examples of compounds having an electron transport ability include oxadiazole derivatives, oxazole derivatives, thiazole derivatives, thiadiazole derivatives, pyrazine derivatives, triazole derivatives, triazine derivatives, perylene derivatives, quinoline derivatives, quinoxaline derivatives, fluorenone derivatives, anthrone derivatives, phenanthroline derivatives, and organic metal complexes.

A material constituting the anode preferably has a high work function. Examples of suitable materials include metals such as gold, platinum, nickel, palladium, cobalt, selenium, and vanadium, alloys in which a plurality of such metals are combined, and metal oxides such as tin oxide, zinc oxide, indium tin oxide (ITO), and indium zinc oxide. Electrically conductive polymers such as polyaniline, polypyrrole, polythiophene, and polyphenylene sulfide can be also used. These electrode substances can be used individually or in combinations of two or more thereof.

On the other hand, a material constituting the cathode preferably has a small work function. Examples of suitable materials include metals such as lithium, sodium, potassium, calcium, magnesium, aluminum, indium, silver, lead, tin, and chromium, or alloys in which a plurality of these metals are combined. Metal oxides such as indium tin oxide (ITO) can be also used. The cathode may be configured by a single layer or a plurality of layers.

A substrate used for the organic light-emitting device in accordance with the present invention is not particularly limited, and non-transparent substrates such as metal substrates and ceramic substrates, and transparent substrates such as glass, quartz, and plastic sheet can be used. Further, the color of emitted light can be controlled using a color filter film, a fluorescent color conversion filter film, or a dielectric reflective film on the substrate.

The produced device can be provided with a protective layer or a sealing layer to prevent the device from contact with oxygen or moisture. Examples of suitable protective layers include inorganic material films such as diamond film, metal oxides, and metal nitrides, polymer films such as fluororesins, polyparaxylene, polyethylene, silicone resins, and polystyrene resin, and also photocurable resins. Further, the device itself also can be covered with glass, air-impermeable film, or a metal and sealed with an appropriate sealing resin.

Where the constituent material of the organic light-emitting device in accordance with the present invention is sublimable, vapor deposition is possible. Therefore, the process for manufacturing the organic light-emitting device in accordance with the present invention is not limited to either a vapor deposition process or a coating process. However, when the molecular weight of the bisfluorene compound represented by Formula [1] or [2] is large, it can be assumed to have a poor sublimation ability. Therefore, in this case, the organic light-emitting device in accordance with the present invention is preferably manufactured by a coating process. Examples of suitable coating processes include a spin coating process, an ink jet process, a printing process, (offset, gravure, relief printing, impression printing, screen printing, etc.), a spraying process, and a liquid development process employing electrophotography, although this list is not limiting.

The display apparatus in accordance with the present invention will be explained below. The display device in accordance with the present invention comprises the organic light-emitting device in accordance with the present invention. The display apparatus in accordance with the present invention is a combination of organic light-emitting devices and thin-film transistors, and can be driven by a passive matrix system or an active matrix system. The display apparatus in accordance with the present invention will be described below in greater detail with reference to the appended drawings by employing an active matrix system by way of example.

Figure 7:
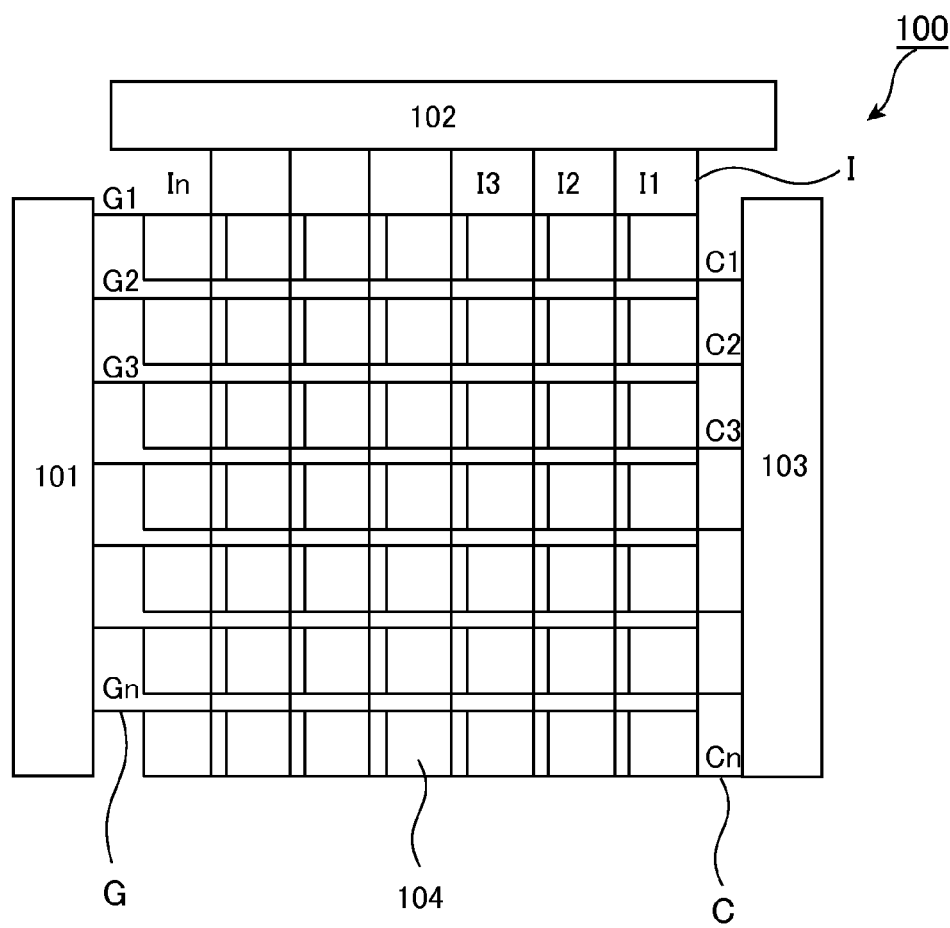
FIG. 7 illustrates schematically a configuration example of a display apparatus comprising the organic light-emitting device in accordance with the present invention and drive means.

FIG. 7 shows schematically a configuration example of a display apparatus comprising organic light-emitting devices in accordance with the present invention and drive means, this configuration representing one embodiment of display apparatus. A display apparatus 100 shown in FIG. 7 has a scan signal driver 101, an information signal driver 102, and a current supply source 103 disposed therein, these components being connected to a gate selection line G, an information signal line I, and a current supply line C, respectively. A pixel circuit 104 is disposed in the intersection of the gate selection line G and information signal line I. The scan signal driver 101 successively selects the gate selection lines G1, G2, G3, . . . Gn. Synchronously with this selection, image signals are applied from the information signal driver 102 to the pixel circuits 104 via any of information signal lines I1, I2, I3, . . . In.

Figure 8:
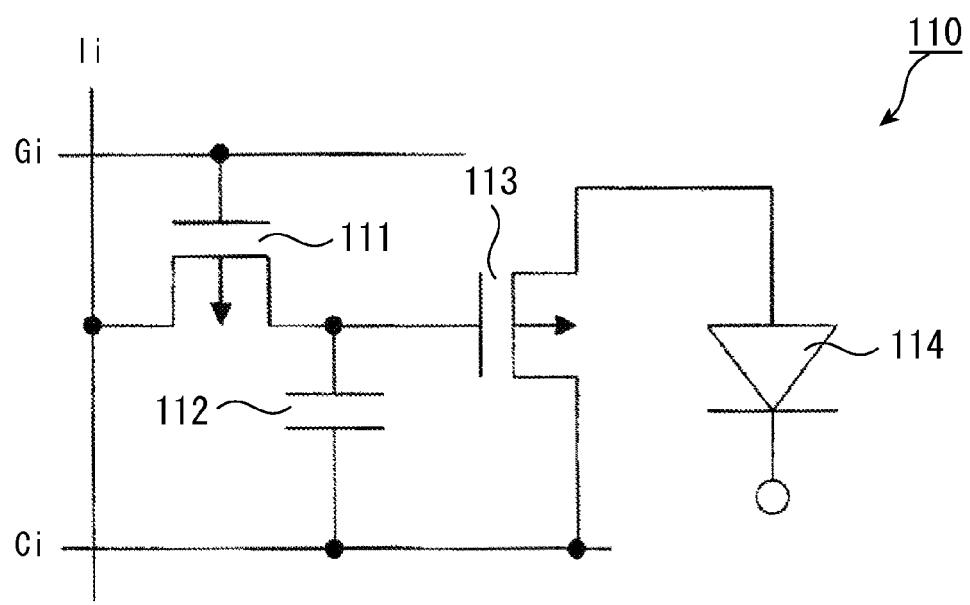
FIG. 8 is a circuit diagram illustrating a circuit constituting one pixel disposed in the display apparatus shown in FIG. 7.

The operation of pixels will be described below. FIG. 8 is a circuit diagram illustrating a circuit constituting one pixel disposed in the display apparatus shown in FIG. 7. In the pixel circuit 110 shown in FIG. 8, where a selection signal is applied to a gate selection line G1, a first thin-film transistor (TFT1) 111 is switched ON and a pixel signal Ii is supplied to a capacitor ($C_{add}$) 112 and determines a gate voltage of a second thin-film transistor (TFT2) 113. An electric current is supplied from a current supply line Ci to an organic luminescence element 114 correspondingly to the gate voltage of the second thin-film transistor (TFT2) 113. The gate potential of the second thin-film transistor (TFT2) 113 is held by the capacitor ($C_{add}$) 112 until the next scan is selected. As a result, the electric current continuously flows in the organic light-emitting device 114 until the next scan is performed. Therefore, the organic light-emitting device 114 can be caused to emit light constantly within one frame period.

Figure 9:
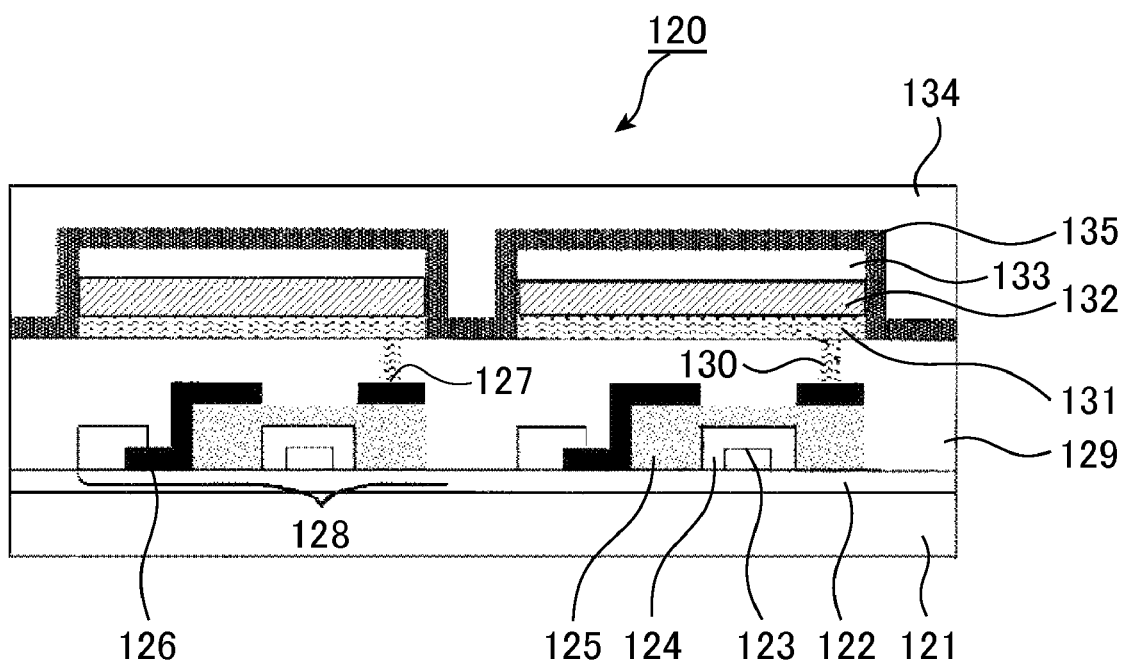
FIG. 9 is a schematic diagram illustrating an example of a cross-sectional structure of a TFT substrate.

FIG. 9 is a schematic drawing illustrating an example of a cross-sectional structure of the TFT substrate used in the display apparatus shown in FIG. 7. The structure will be described below in greater detail, while illustrating an example of a process for manufacturing the TFT substrate. When the display apparatus 120 shown in FIG. 9 is manufactured, first, a moisture-resistant film 122 is coated on a substrate 121 such as glass to protect a member (TFT or organic layer) that will be produced thereupon. Silicon oxide or a composite of silicon oxide and silicon nitride can be used as a material constituting the moisture-resistant film 122. Then, a gate electrode 123 patterned to a predetermined circuit shape is formed by forming a film of a metal such as Cr by sputtering. A film 124 of silicon oxide or the like is then produced by a plasma CVD method or a catalytic chemical vapor deposition method (cat-CVD method). A silicon film is thereafter produced by a plasma CVD method or the like (in some cases annealing is performed at a temperature equal to or higher than 290° C.), and a semiconductor layer 125 is formed by patterning according to the circuit shape.

A TFT element 128 is further produced by providing a drain electrode 126 and a source electrode 127 on the semiconductor film 125, and then a circuit as shown in FIG. 8 is formed. Then, an insulating film 129 is formed on the TFT element 128. A contact hole (through hole) 130 is thereafter formed to connect a metallic anode 131 for an organic light-emitting device and the source electrode 127.

A display apparatus 120 can be obtained by successively laminating multilayer or monolayer organic layer 132 and a cathode 133 on the anode 131. In this case, a first protective layer 134 or a second protective layer 135 may be provided to prevent the organic light-emitting device from deterioration. Operating the display apparatus using the bisfluorene compound in accordance with the present invention enables high-quality display demonstrating long-term stability.

In the above-described display apparatus, the switching elements are not particularly limited, and a monocrystalline silicon substrate, a MIM element, and a-Si type can be easily applied.

EXAMPLES

The present invention will be described below in greater detail based on examples thereof, but the present invention is not limited to these examples.

Synthesis Example 1

Synthesis of Compound (2)

A Compound (2) shown below was synthesized by the below-described reaction.

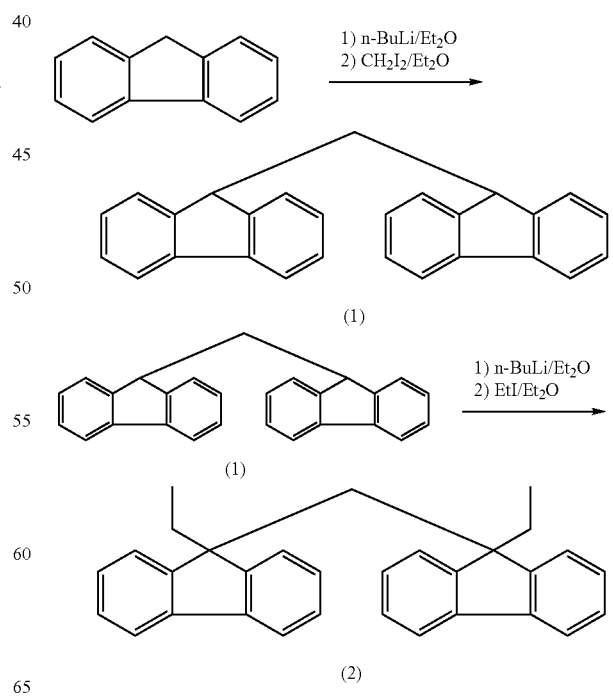

(i) A total of 10 g (60.2 mmol) of fluorene and 300 mL of diethyl ether were introduced into a three-neck flask with a capacity of 500 mL, and then 40.6 mL (62.8 mmol) of a 15% hexane solution of n-butyllithium was dropwise added at −78° C. under a nitrogen atmosphere. The temperature of the reaction solution was then gradually raised to room temperature, and the reaction solution was thereafter stirred for 1 hour at room temperature. The reaction solution was then cooled to −78° C., and a mixed solution of 2.2 mL (27.3 mmol) of diiodomethane and 10 mL of diethyl ether was then dropwise added. The temperature of the reaction solution was then gradually raised to room temperature, and the reaction solution was thereafter stirred for 8 hours (h) at room temperature. Upon completion of the reaction, the organic layer was extracted with chloroform and dried with anhydrous sodium sulfate. The solvent was then distilled off under reduced pressure. The crude product thus obtained was purified by silica gel column chromatography (developing solvent: mixed solvent of hexane and toluene) to obtain 5.6 g (yield 60%) of Compound (1) (bisfluorene) in the form of white crystals.

(ii) A total of 1.0 g (1.4 mmol) of Compound (1) and 120 mL of diethyl ether were then introduced into a three-neck flask with a capacity of 200 mL, and 4.3 mL (6.7 mmol) of a 15% hexane solution of n-butyllithium was dropwise added at −78° C. under a nitrogen atmosphere. The temperature of the reaction solution was then gradually raised to room temperature, and the reaction solution was stirred for 1 hour at room temperature. The reaction solution was thereafter cooled to −78° C., and a solution prepared by mixing 1.27 g (8.1 mmol) of iodoethane and 5 mL of diethyl ether was dropwise added. The temperature of the reaction solution was then gradually raised to room temperature, and the reaction liquid was stirred for 8 hours at room temperature. Upon completion of the reaction, the organic layer was extracted with chloroform and dried with anhydrous sodium sulfate. The solvent was then distilled off under reduced pressure. The crude product thus obtained was purified by silica gel column chromatography (developing solvent: mixed solvent of hexane and toluene) to obtain 0.77 g (yield 66%) of Compound (2) in the form of white crystals.

Synthesis Example 2

Synthesis of Compound (3)

A Compound (3) shown below was synthesized by the below-described reaction.

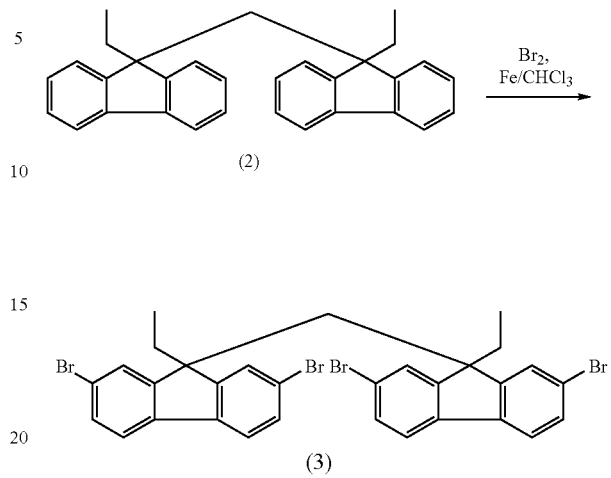

A total of 1.0 g (2.9 mmol) of Compound (2), 1.8 g (11.6 mmol) of bromine, a small amount (random amount) of iron powder, and 120 mL of chloroform were loaded in a three-neck flask with a capacity of 200 mL, and the reaction solution was then stirred for 2 hours at room temperature. Upon completion of the reaction, an aqueous solution of sodium thiosulfate was charged into the reaction solution. The organic layer was then extracted and washed with water. Then, anhydrous sodium sulfate was charged and the organic layer was dehydrated and dried. The organic layer was then concentrated under reduced pressure and the concentrate obtained was purified by silica gel column chromatography (developing solvent: mixed solvent of hexane and toluene). The purified product thus obtained was extracted with methanol to obtain 1.42 g (yield 68%) of brominated bisfluorene, which is Compound (3), in the form of light-yellow crystals.

Synthesis Example 3

Synthesis of Exemplary Compound No. 107

A Compound (5) (Exemplary Compound No. 107) shown below was synthesized by the below-described reaction.

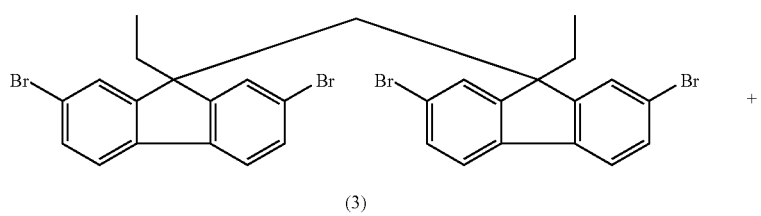

-continued

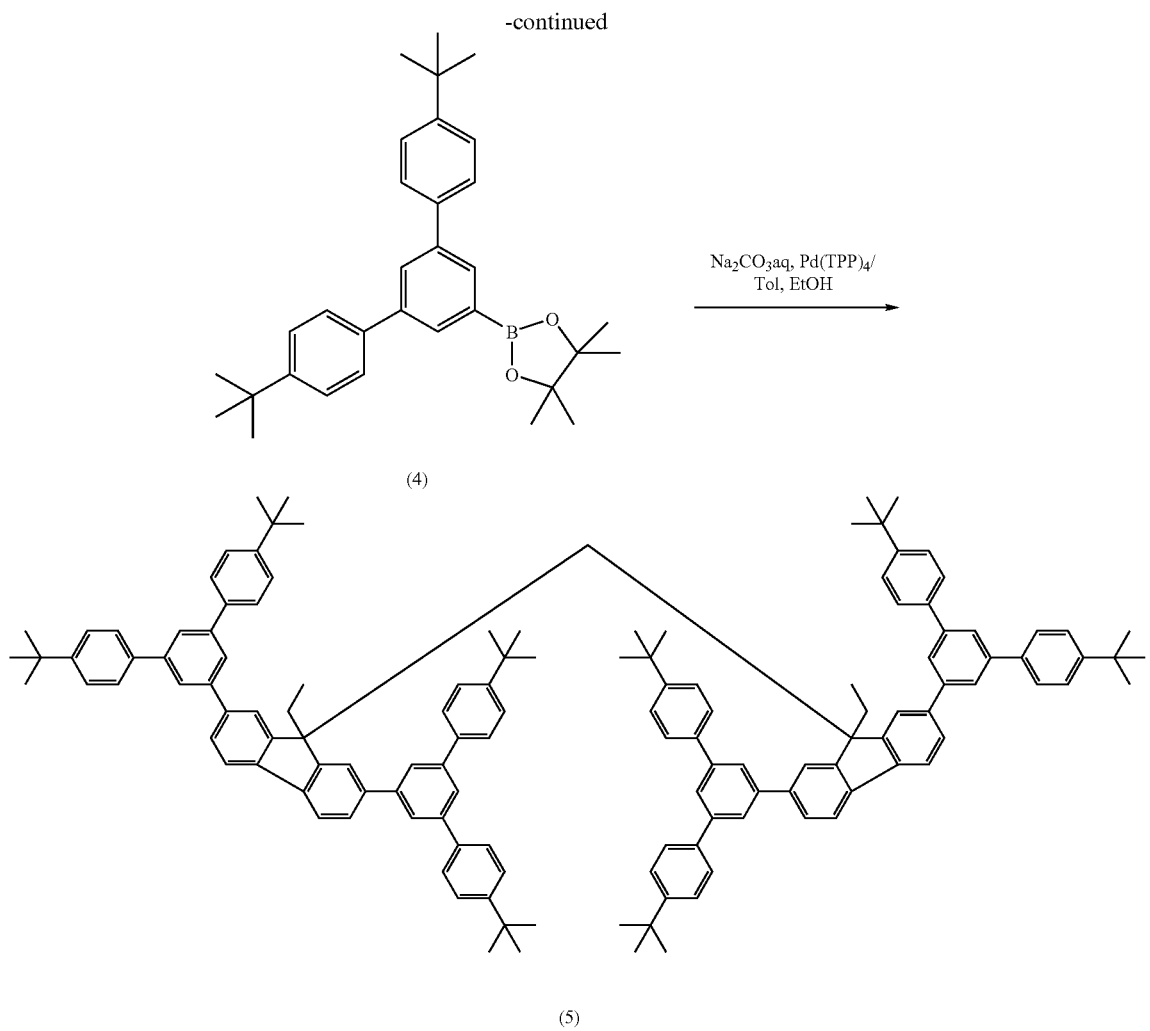

(4)

(5)

The below-described reagents and solvent were loaded into a three-neck flask with a capacity of 200 mL, followed by stirring for 16 hours at 85° C.
Compound (3): 1.0 g (1.4 mmol).
Compound (4): 3.3 g (7 mmol).
Tetrakistriphenylphosphinepalladium (0) (Pd(TPP)$_4$): 0.15 g (0.13 mmol).
Saturated aqueous solution of sodium carbonate: 15 mL.
Toluene 60 mL.

Upon completion of the reaction, the organic layer was fractionated and purified by silica gel column chromatography (developing solvent: mixed solvent of hexane and ethyl acetate). The purified product was then extracted with methanol to obtain 0.62 g (yield 25%) of Compound (5) (Exemplary Compound No. 107) in the form of white crystals.

Synthesis Example 4

Synthesis of Compound (7) (Exemplary Compound No. 114)

A Compound (7) (Exemplary Compound No. 114) shown below was synthesized by the below-described reaction.

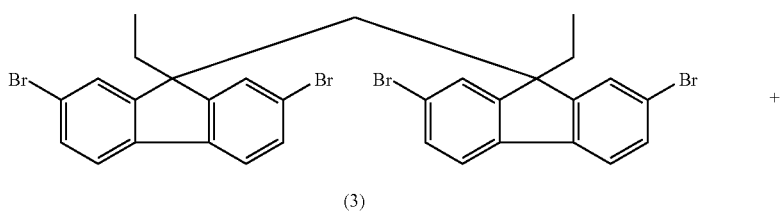

(3)

-continued

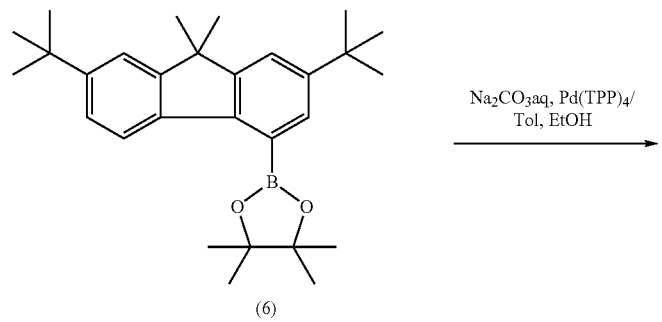

(6)

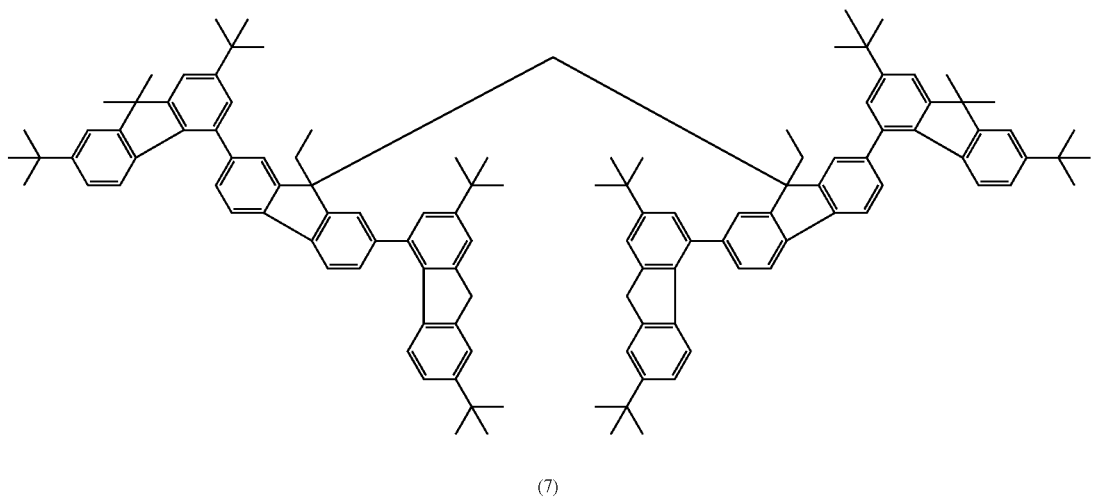

(7)

The below-described reagents and solvent were loaded into a three-neck flask with a capacity of 200 mL, followed by stirring for 16 hours at 85° C.

Compound (3): 1.0 g (1.4 mmol).
Compound (6): 3 g (7 mmol).
Tetrakistriphenylphosphinepalladium (0) (Pd(TPP)$_4$): 0.15 g (0.13 mmol).
Saturated aqueous solution of sodium carbonate: 15 mL.
Toluene 60 mL.

Upon completion of the reaction, the organic layer was fractionated and purified by silica gel column chromatography (developing solvent: mixed solvent of hexane and ethyl acetate). The purified product was then extracted with methanol to obtain 0.85 g (yield 38%) of Compound (7) (Exemplary Compound No. 113) in the form of white crystals.

Synthesis Example 5

Synthesis of Compound (9) (Exemplary Compound No. 120)

A Compound (9) (Exemplary Compound No. 120) shown below was synthesized by the below-described reaction.

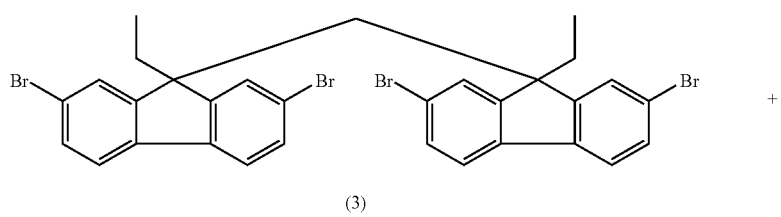

(3)

+

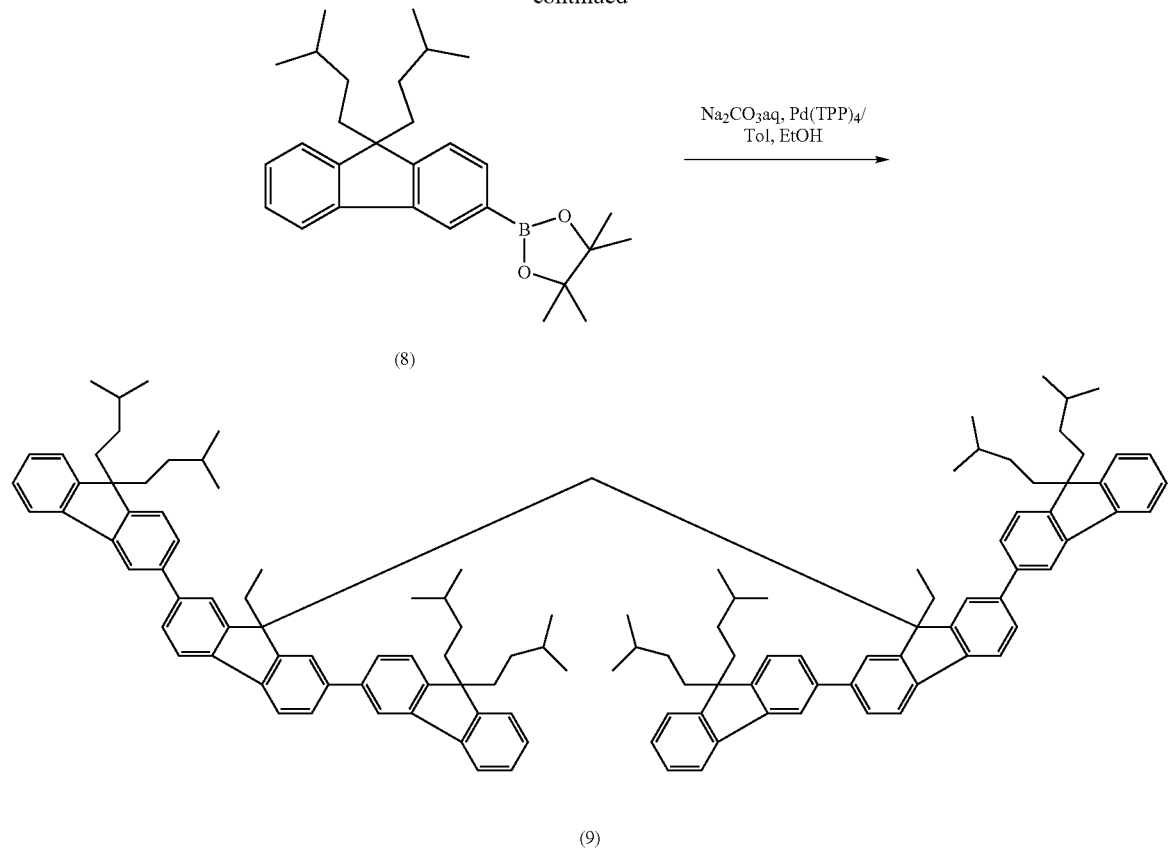

The below-described reagents and solvent were loaded into a three-neck flask with a capacity of 200 mL, followed by stirring for 16 hours at 85° C.
Compound (3): 1.0 g (1.4 mmol).
Compound (8): 3 g (7 mmol).
Tetrakistriphenylphosphinepalladium (0) (Pd(TPP)$_4$): 0.15 g (0.13 mmol).
Saturated aqueous solution of sodium carbonate: 15 mL.
Toluene: 60 mL.

Upon completion of the reaction, the organic layer was fractionated and purified by silica gel column chromatography (developing solvent: mixed solvent of hexane and ethyl acetate). The purified product was then extracted with methanol to obtain 1.1 g (yield 49%) of Compound (9) (Exemplary Compound No. 120) in the form of white crystals.

Synthesis Example 6

Synthesis of Compound (12)

A Compound (12) shown below was synthesized by the below-described reaction.

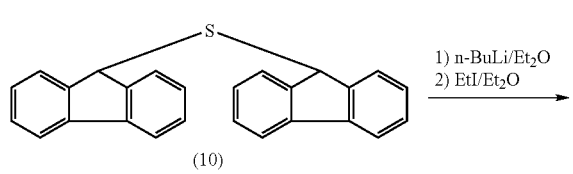

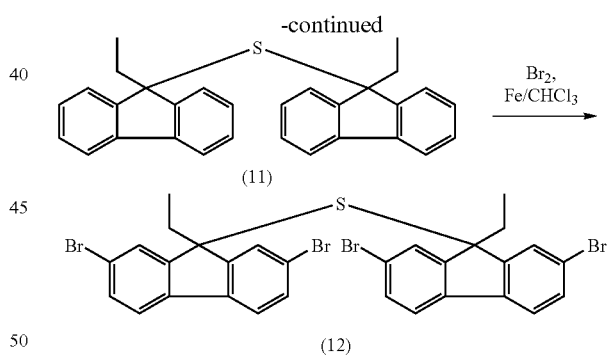

(i) A total of 1 g (2.76 mmol) of Compound (10) obtained according to the method described in Organometallics, 19, 1434 (2000) and 50 mL of anhydrous diethyl ether were placed in a three-neck flask with a capacity of 300 mL. The reaction solution was then cooled to −60° C. in a dry ice-methanol bath under a nitrogen atmosphere. Then, 3.8 mL (6.11 mmol) of n-BuLi (1.6 mol/L hexane solution) was gradually dropwise added. Upon completion of dropwise addition, stirring was further conducted for 7 hours. A total of 0.95 g (6.1 mmol) of ethyl iodide was then charged into the reaction solution, the temperature of the reaction solution was then raised to −25° C., and stirring was performed for 1 hour. The temperature of the reaction solution was thereafter raised to room temperature and stirring was performed for 1 hour. A precipitate obtained by distilling off the solvent under reduced pressure upon completion of the reaction was dissolved in chloroform and purified by column chromatography (column packing: silica gel, developing solvent: chloroform/heptane=2/3). Subsequent recrystallization with methanol produced 0.51 g (yield 44%) of Compound (11).

(ii) The following reagents and solvent were loaded into a three-neck flask with a capacity of 200 mL and a nitrogen atmosphere was produced inside the flask.

quent recrystallization with methanol produced 0.78 g (yield 89%) of Compound (12).

Synthesis Example 7

Synthesis of Exemplary Compound No. 117

A Compound (13) (Exemplary Compound No. 117) shown below was synthesized by the below-described reaction.

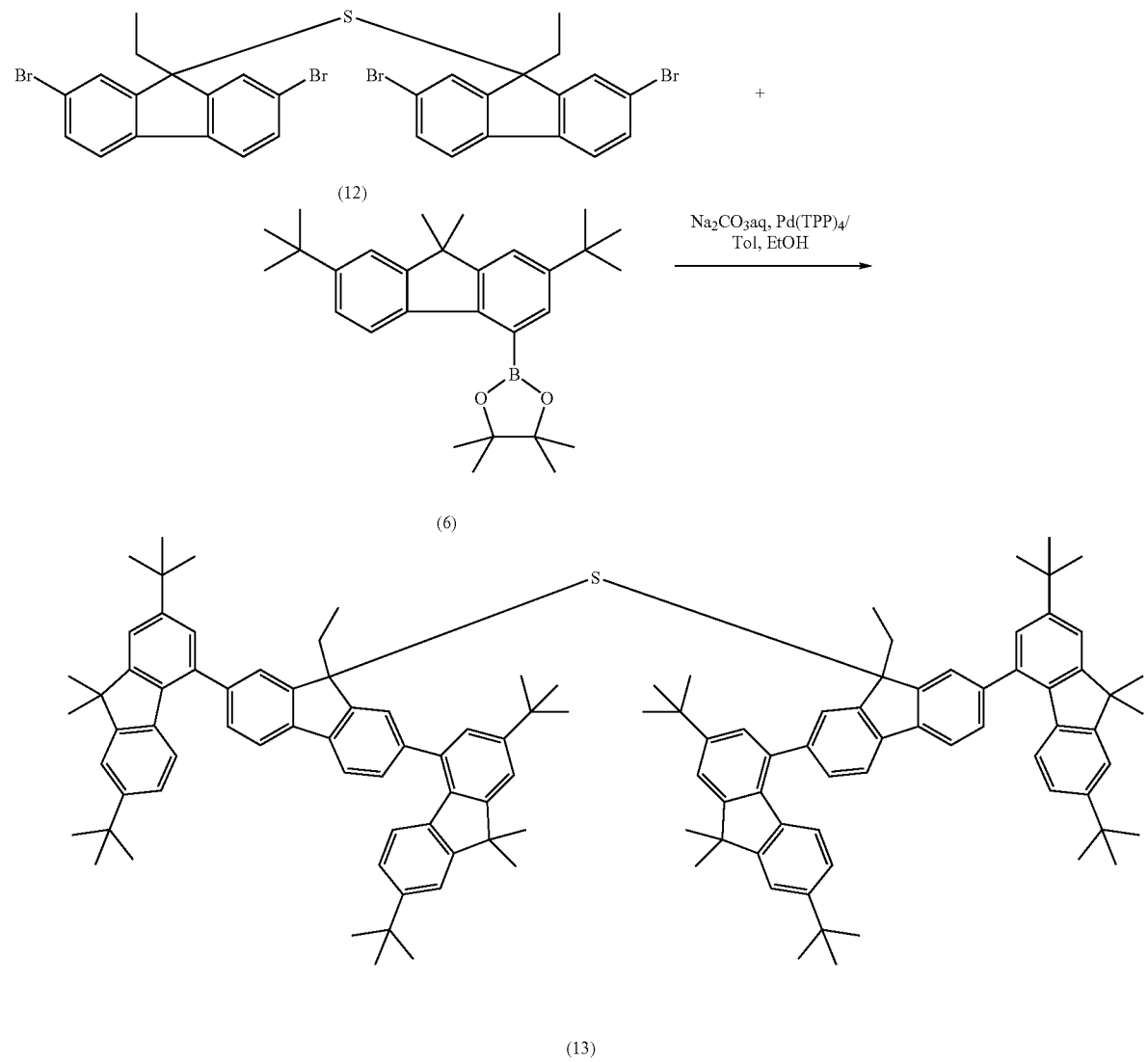

Compound (11): 0.5 g (1.2 mmol)
Chloroform: 30 mL.
Iron powder: 0.05 g (0.9 mmol).

A total of 0.76 g (9.6 mmol) of bromine was then gradually charged at room temperature and the reaction solution was then stirred for 3 hours. The reaction solution was thereafter heated to 50° C. and stirred for 4 hours. A precipitate obtained by distilling off the solvent under reduced pressure upon completion of the reaction was dissolved in chloroform and purified by column chromatography (column packing: silica gel, developing solvent: chloroform/heptane=2/3). Subse- The below-described reagents and solvents were loaded into a three-neck flask with a capacity of 300 mL, and a nitrogen atmosphere was produced inside the flask.

Compound (12): 0.75 g (1.02 mmol).
Compound (6): 2.65 g (6.13 mmol).
Pd(TPP)$_4$ (tetraphosphinopalladium catalyst) 0.46 g (0.4 mmol).
Saturated aqueous solution of sodium carbonate: 3 mL.
Toluene: 15 mL.
Ethanol: 3 mL.

The reaction solution was then stirred for 27 hours, while being maintained at 85° C. A precipitate obtained by distilling off the solvent under reduced pressure upon completion of the reaction was dissolved in chloroform and purified by column chromatography (column packing: silica gel, developing solvent: heptane/chloroform=4/1). Subsequent recrystallization with methanol produced 0.43 g (yield 26%) of Compound (13) (Exemplary Compound No. 117).

Synthesis Example 8

Synthesis of Compound (16)

A Compound (16) shown below was synthesized by the below-described reaction.

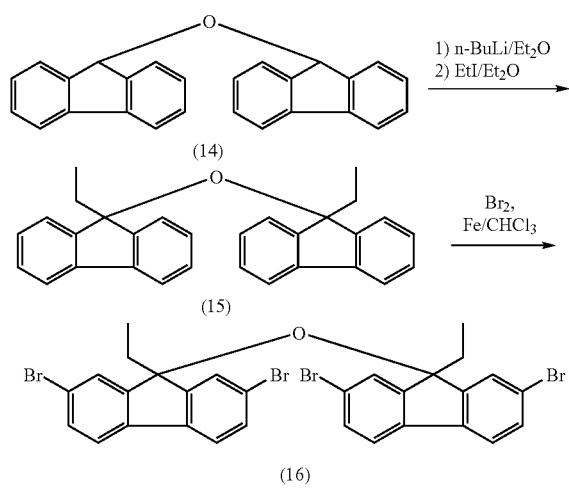

(i) A total of 1 g (2.9 mmol) of Compound (14) obtained according to the method described in Organometallics, 19, 1434 (2000) and 50 mL of anhydrous diethyl ether were placed in a three-neck flask with a capacity of 300 mL. The reaction solution was then cooled to −60° C. in a dry ice-methanol bath under a nitrogen atmosphere. Then, 3.96 mL (6.3 mmol) of n-BuLi (1.6 mol/L hexane solution) was gradually dropwise added. Upon completion of dropwise addition, the reaction solution was further stirred for 7 hours. A total of 0.99 g (6.3 mmol) of ethyl iodide was then charged into the reaction solution, the temperature of the reaction solution was then raised to −25° C., and stirring was performed for 1 hour. The temperature of the reaction solution was thereafter raised to room temperature and stirring was performed for 1 hour. A precipitate obtained by distilling off the solvent under reduced pressure upon completion of the reaction was dissolved in chloroform and purified by column chromatography (column packing: silica gel, developing solvent: chloroform/heptane=2/3). Subsequent recrystallization with methanol produced 0.73 g (yield 63%) of Compound (15).

(ii) The following reagents and solvent were loaded into a three-neck flask with a capacity of 200 mL and a nitrogen atmosphere was produced inside the flask.
Compound (15): 0.7 g (1.74 mmol).
Chloroform: 30 mL.
Iron powder: 0.05 g (0.9 mmol).
A total of 1.1 g (13.9 mmol) of bromine was then gradually charged at room temperature and the reaction solution was stirred for 3 hours. The reaction solution was thereafter heated to 50° C. and stirred for 4 hours. A precipitate obtained by distilling off the solvent under reduced pressure upon completion of the reaction was dissolved in chloroform and purified by column chromatography (column packing: silica gel, developing solvent: chloroform/heptane=2/3). Subsequent recrystallization with methanol produced 1.1 g (yield 88%) of Compound (16).

Synthesis Example 9

Synthesis of Exemplary Compound No. 121

A Compound (18) (Exemplary Compound No. 121) shown below was synthesized by the below-described reaction.

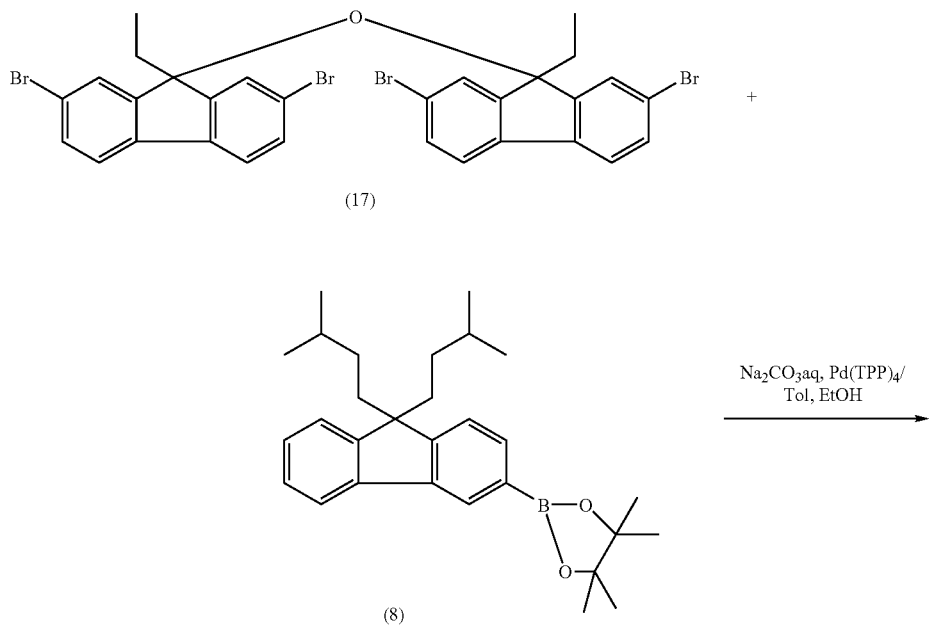

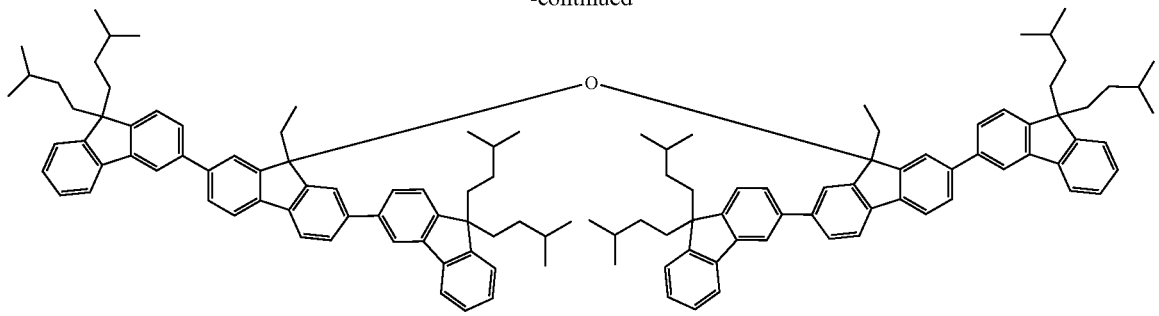

(18)

The below-described reagents and solvents were loaded into a three-neck flask with a capacity of 300 mL, and a nitrogen atmosphere was produced inside the flask.

Compound (17): 1 g (1.4 mmol).
Compound (8): 3.6 g (8.6 mmol).
Pd(TPP)$_4$ (tetraphosphinopalladium catalyst) 0.46 g (0.4 mmol).
Saturated aqueous solution of sodium carbonate: 4 mL.
Toluene: 20 mL.
Ethanol: 4 mL.

The reaction solution was then stirred for 24 hours, while being maintained at 85° C. A precipitate obtained by distilling off the solvent under reduced pressure upon completion of the reaction was dissolved in chloroform and purified by column chromatography (column packing: silica gel, developing solvent: heptane/chloroform=4/1). Subsequent recrystallization with methanol produced 0.62 g (yield 27%) of target Compound (18) (Exemplary Compound No. 121).

Synthesis Example 10

Synthesis of Compound (21)

A Compound (21) shown below was synthesized by the below-described reaction.

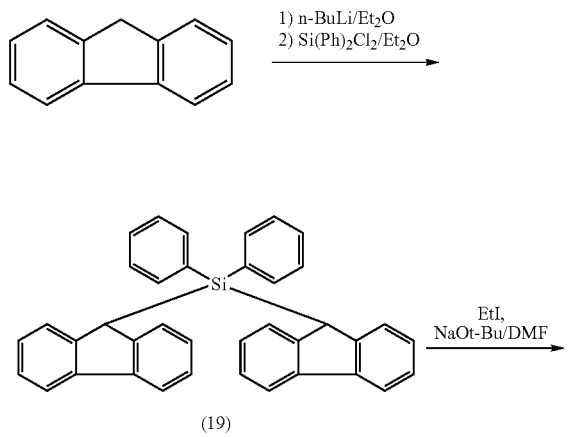

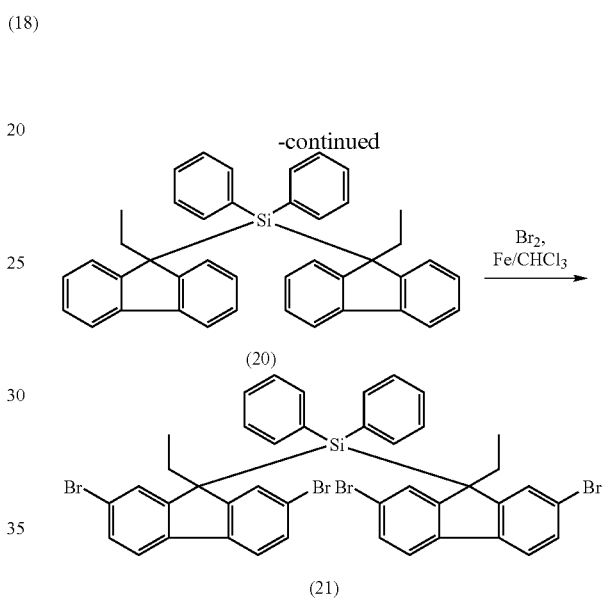

(i) A total of 1.6 g (9.6 mmol) of fluorene and 50 mL of anhydrous diethyl ether were placed in a three-neck flask with a capacity of 300 mL and the reaction solution was cooled to −60° C. in a dry ice-methanol bath under a nitrogen atmosphere. Then, 7.2 mL (11.6 mmol) of n-BuLi (1.6 mol/L hexane solution) was gradually dropwise added. Upon completion of dropwise addition, the reaction solution was further stirred for 5 hours. A total of 1.2 g (4.8 mmol) of diphenyldichlorosilane was then charged into the reaction solution, the temperature of the reaction solution was raised to 0° C., and stirring was performed for 4 hours. A precipitate obtained by distilling off the solvent under reduced pressure upon completion of the reaction was dissolved in chloroform and purified by column chromatography (column packing: silica gel, developing solvent: chloroform/heptane=2/3). Subsequent recrystallization with methanol produced 1.9 g (yield 77%) of Compound (19).

(ii) The following reagents and solvent were loaded into a three-neck flask with a capacity of 300 mL and a nitrogen atmosphere was produced inside the flask.

Compound (19): 1.9 g (3.7 mmol).
Tertiary butoxysodium: 0.88 g (9.3 mmol).
Ethyl iodide: 1.4 g (9.3 mmol).
Anhydrous DMF (dimethylformamide): 50 mL.

The reaction solution was then stirred for 24 hours, while being maintained at room temperature. Upon completion of the reaction, a precipitate was filtered, dissolved in chloroform, and purified by column chromatography (column packing: silica gel, developing solvent: chloroform/heptane=1/4). Subsequent recrystallization with methanol produced 1.8 g (yield 86%) of Compound (20).

(iii) The following reagents and solvent were loaded into a three-neck flask with a capacity of 200 mL and a nitrogen atmosphere was produced inside the flask.
Compound (20): 1.8 g (3.2 mmol).
Chloroform: 40 mL.
Iron powder: 0.05 g (0.9 mmol).

A total of 2.0 g (25.3 mmol) of bromine was then gradually charged at room temperature and the reaction solution was stirred for 3 hours. The reaction solution was thereafter heated to 50° C. and stirred for 7 hours. A precipitate obtained by distilling off the solvent under reduced pressure upon completion of the reaction was dissolved in chloroform and purified by column chromatography (column packing: silica gel, developing solvent: chloroform/heptane=2/3). Subsequent recrystallization with methanol produced 2.3 g (yield 82%) of Compound (21).

Synthesis Example 11

Synthesis of Exemplary Compound No. 118

A Compound (22) (Exemplary Compound No. 118) shown below was synthesized by the below-described reaction.

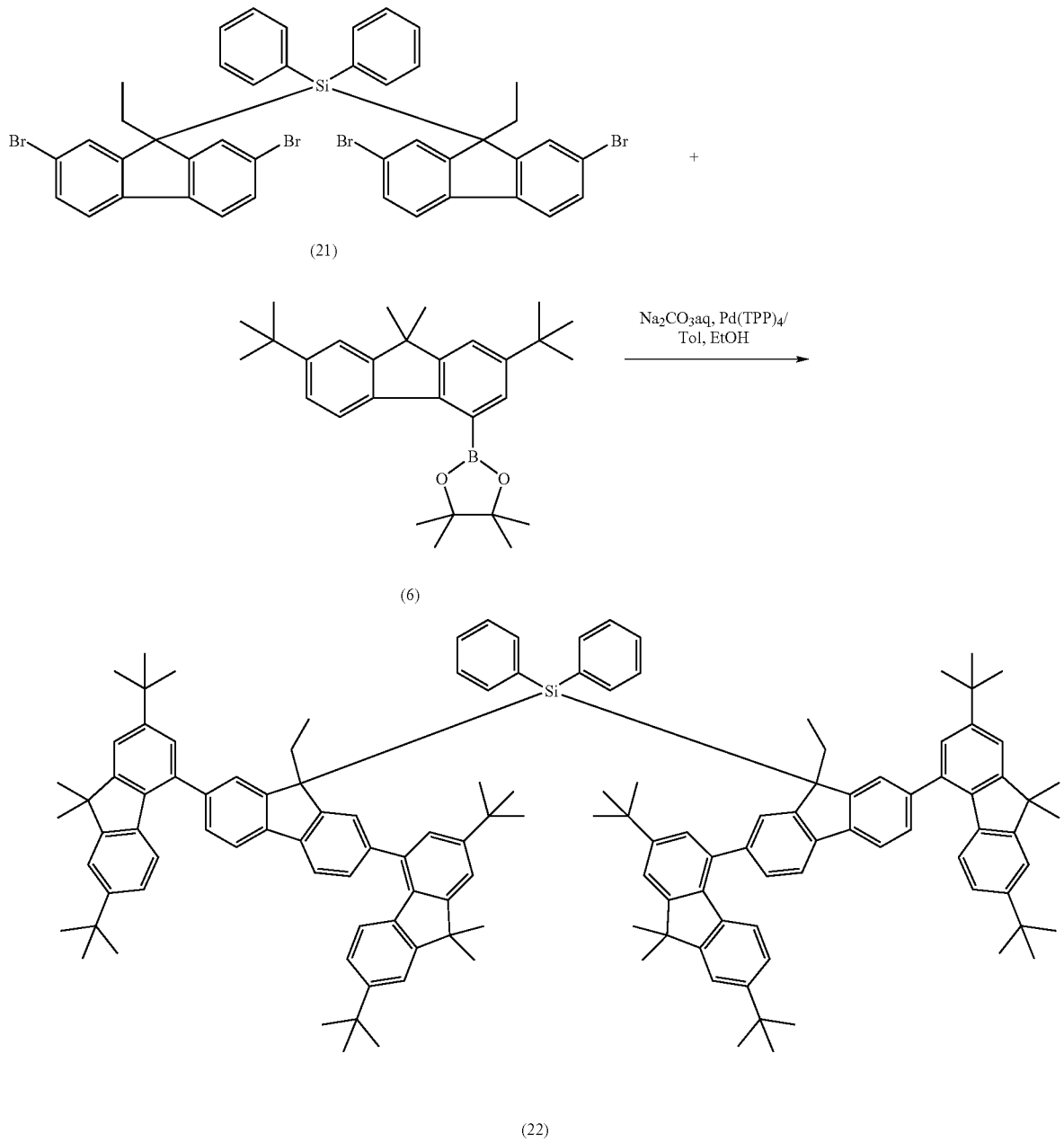

The following reagents and solvents were loaded into a three-neck flask with a capacity of 300 mL and a nitrogen atmosphere was produced inside the flask.
Compound (21): 1 g (1.1 mmol).
Compound (6): 2.9 g (6.8 mmol).
Pd(TPP)$_4$ (tetraphosphinopalladium catalyst) 0.46 g (0.4 mmol).
Saturated aqueous solution of sodium carbonate: 4 mL.
Toluene: 20 mL.
Ethanol: 4 mL.

The reaction solution was then stirred for 24 hours, while being maintained at 85° C. A precipitate obtained by distilling off the solvent under reduced pressure upon completion of the reaction was purified by column chromatography (column packing: silica gel, developing solvent: heptane/chloroform=4/1). Subsequent recrystallization with methanol produced g (yield 27%) of target Compound (22) (Exemplary Compound No. 118).

Synthesis Example 12

Synthesis of Compound (25)

A Compound (25) shown below was synthesized by the below-described reaction.

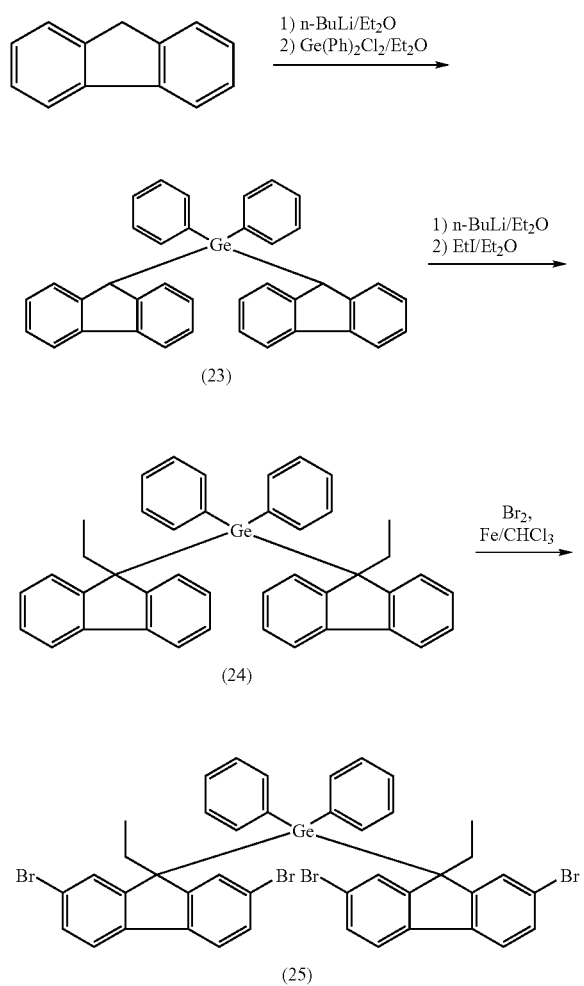

(i) A total of 1.6 g (9.6 mmol) of fluorene and 50 mL of anhydrous diethyl ether were placed in a three-neck flask with a capacity of 300 mL. The reaction solution was then cooled to −60° C. in a dry ice-methanol bath under a nitrogen atmosphere. Then, 7.2 mL (11.6 mmol) of n-BuLi (1.6 mol/L hexane solution) was gradually dropwise added. Upon completion of dropwise addition, the reaction solution was further stirred for 5 hours. A total of 1.4 g (4.8 mmol) of diphenyldichlorogermanium was then charged into the reaction solution, the temperature of the reaction solution was then raised to 0° C., and stirring was performed for 4 hours. A precipitate obtained by distilling off the solvent under reduced pressure upon completion of the reaction was dissolved in chloroform and purified by column chromatography (column packing: silica gel, developing solvent: chloroform/heptane=2/3). Subsequent recrystallization with methanol produced 1.68 g (yield 63%) of Compound (23).

(ii) The following reagents and solvent were loaded into a three-neck flask with a capacity of 300 mL and a nitrogen atmosphere was produced inside the flask.
Compound (23): 1.65 g (3.7 mmol).
Tertiary butoxysodium: 0.7 g (7.4 mmol).
Ethyl iodide: 1.15 g (7.4 mmol).
Anhydrous DMF (dimethylformamide): 50 mL.

The reaction solution was then stirred for 24 hours, while being maintained at room temperature. Upon completion of the reaction, a precipitate was filtered, dissolved in chloroform, and purified by column chromatography (column packing: silica gel, developing solvent: chloroform/heptane=1/4). Subsequent recrystallization with methanol produced 1.5 g (yield 82%) of Compound (24).

(iii) The following reagents and solvent were loaded into a three-neck flask with a capacity of 200 mL and a nitrogen atmosphere was produced inside the flask.
Compound (24): 1.5 g (2.4 mmol).
Chloroform: 40 mL.
Iron powder: 0.05 g (0.9 mmol).

A total of 1.6 g (19.6 mmol) of bromine was then gradually charged at room temperature and the reaction solution was stirred for 3 hours. The reaction solution was thereafter heated to 50° C. and stirred for 7 hours. A precipitate obtained by distilling off the solvent under reduced pressure upon completion of the reaction was dissolved in chloroform and purified by column chromatography (column packing: silica gel, developing solvent: chloroform/heptane=2/3). Subsequent recrystallization with methanol produced 1.4 g (yield 62%) of Compound (25).

Synthesis Example 13

Synthesis of Exemplary Compound No. 123

A Compound (27) (Exemplary Compound No. 123) shown below was synthesized by the below-described reaction.

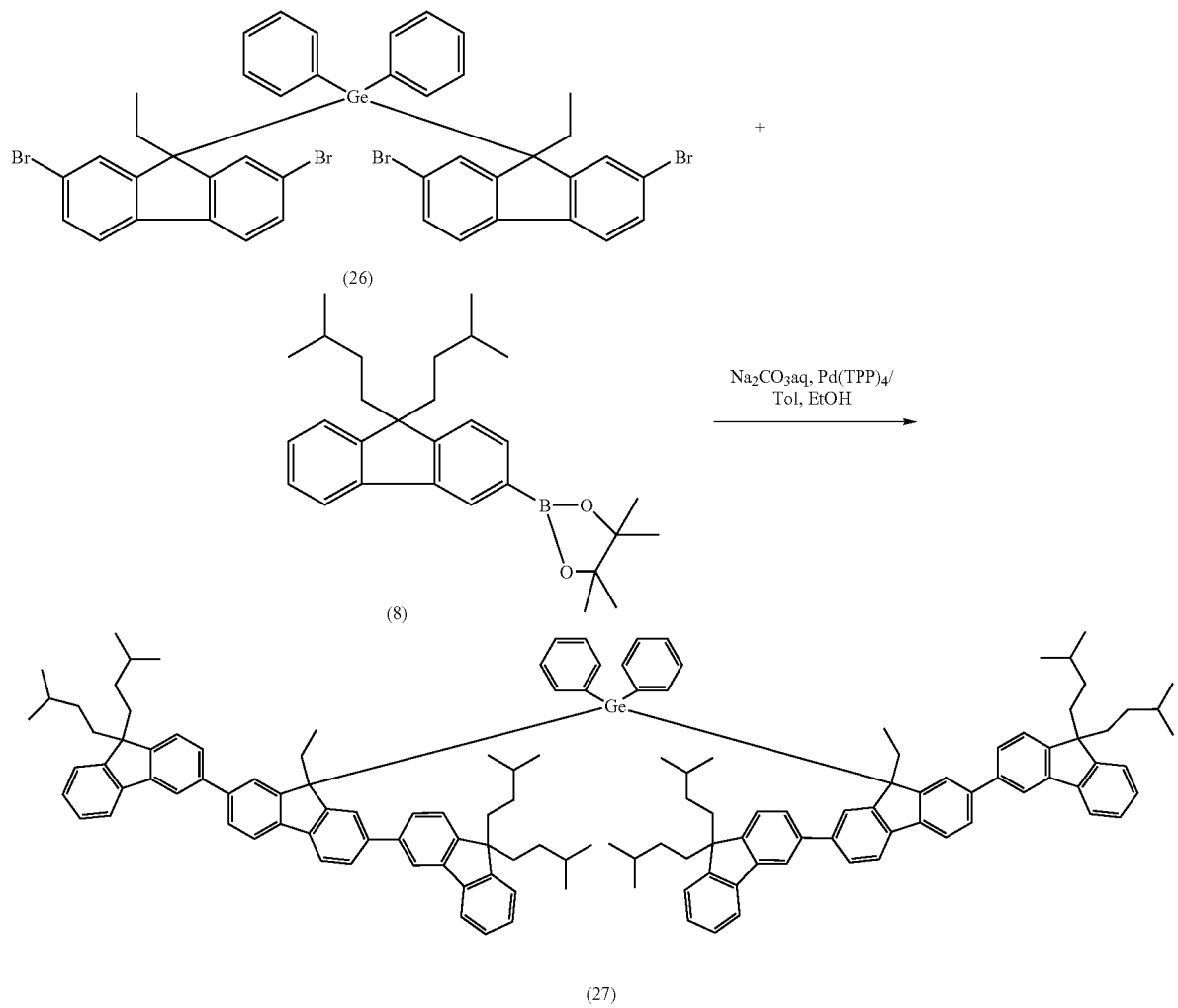

The following reagents and solvents were loaded into a three-neck flask with a capacity of 300 mL and a nitrogen atmosphere was produced inside the flask.
Compound (26): 1 g (1.1 mmol).
Compound (8): 2.9 g (6.8 mmol).
Pd(TPP)$_4$ (tetraphosphinopalladium catalyst) 0.46 g (0.4 mmol).
Saturated aqueous solution of sodium carbonate: 4 mL.
Toluene: 20 mL.
Ethanol: 4 mL.

The reaction solution was then stirred for 24 hours, while being maintained at 85° C. A precipitate obtained by distilling off the solvent under reduced pressure upon completion of the reaction was purified by column chromatography (column packing: silica gel, developing solvent: heptane/chloroform=4/1). Subsequent recrystallization with methanol produced 0.33 g (yield 17%) of target Compound (27) (Exemplary Compound No. 123).

Example 1

An organic light-emitting device shown in FIG. 5 and using Exemplary Compound No. 107 as a host for a green phosphorescence material was fabricated and evaluated.

First, a film of indium tin oxide (ITO) was formed by sputtering on a glass substrate (substrate 1) and an anode 2 was formed. The film thickness of the anode 2 was 120 nm. The substrate with the film of anode 2 formed thereon was then successively ultrasonically washed in acetone and isopropyl alcohol (IPA), washed in boiling IPA, and dried. Then UV/ozone washing was conducted. The substrate treated in this manner was used as a transparent conductive support substrate.

A hole injection layer 7 was then formed on the transparent conductive support substrate by spin coating PEDOT/PSS (Baytron P AI 4083; manufactured by H. C. Stark Co.), which is a hole injection material. In this case, the film thickness of the hole injection layer was 330 Å.

A xylene solution containing Exemplary Compound No. 107, which is a host, and the below-described green phosphorescence material, which is a guest, was prepared. When the xylene solution was prepared, the total weight concentration of the host and guest, which were solutes, was 1.2 wt. %, and the weight ratio of the host and guest was 99:1. The prepared xylene solution was dripped onto the host injection layer 7 and spin coated by 1000 revolutions to form a light-emitting layer 3. The light-emitting layer 3 had a thickness of 600 Å.

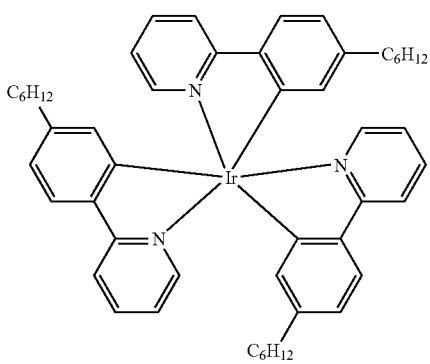

An electron injection layer 8 was then formed by vapor depositing metallic Ca on the light-emitting layer 3. The electron injection layer 8 had a thickness of 50 nm, the degree of vacuum during vapor deposition was $3 \times 10^{-6}$ Torr, and the deposition rate of Ca was 0.5 nm/sec.

A cathode 4 was then formed by vacuum vapor deposition of metallic Al. The thickness of the cathode 4 was 100 nm, the degree of vacuum during vapor deposition was $3 \times 10^{-6}$ Torr, and the deposition rate of Al was 2 Å/sec to 3 Å/sec.

The above-described process produced an organic light-emitting device.

The element obtained was operated by passing a direct current with a current density of 5 mA/cm$^2$ by using the ITO electrode as a positive electrode and the Al electrode as a negative electrode. As a result, green luminescence with a luminance of 800 cd/m$^2$ was obtained.

Example 2 Through Example 5

An element was fabricated by the same method as in EXAMPLE 1, except that the compounds shown in Table 1 were individually used as a host of the light-emitting layer 3 instead of the Exemplary Compound No. 107. The elements obtained were evaluated in the same manner as in EXAMPLE 1. The results are shown in Table 1.

Comparative Example 1

An element was fabricated by the same method as in EXAMPLE 1, except that polyfluorene (manufactured by H. W. Sands Co., molecular weight 76,000) that was a comparative compound was used as a host of the light-emitting layer instead of the Exemplary Compound No. 107. The element obtained was evaluated in the same manner as in EXAMPLE 1. The results are shown in Table 1.

TABLE 1

| | Host | Luminance at mA/cm$^2$ (cd/m$^2$) | Emission color |
|---|---|---|---|
| EXAMPLE 1 | Exemplary compound No. 107 | 800 | Green |
| EXAMPLE 2 | Exemplary compound No. 114 | 769 | Green |
| EXAMPLE 3 | Exemplary compound No. 117 | 658 | Green |
| EXAMPLE 4 | Exemplary compound No. 120 | 1140 | Green |
| EXAMPLE 5 | Exemplary compound No. 121 | 1054 | Green |
| COMPARATIVE EXAMPLE 1 | Polyfluorene | 225 | Green |

Example 6

An organic light-emitting device shown in FIG. 5 and using Exemplary Compound No. 118 as a host for a red phosphorescence material was fabricated and evaluated.

First, a film of indium tin oxide (ITO) was formed by sputtering on a glass substrate (substrate 1) and an anode 2 was formed. The film thickness of the anode 2 was 120 nm. The substrate with the film of anode 2 formed thereon was then successively ultrasonically washed in acetone and isopropyl alcohol (IPA), washed in boiling IPA, and dried. Then UV/ozone washing was conducted. The substrate treated in this manner was used as a transparent conductive support substrate.

A hole injection layer 7 was then formed on the transparent conductive support substrate by spin coating PEDOT/PSS (Baytron P AI 4083; manufactured by H. C. Stark Co.), which is a hole injection material. In this case, the film thickness of the hole injection layer was 330 Å.

A xylene solution containing Exemplary Compound No. 118, which was a host, and the below-described red phosphorescence material, which was a guest, was prepared. When the xylene solution was prepared, the total weight of the host and guest, which were solutes, was 1.2 wt. %, and the weight ratio of the host and guest was 99:1. The prepared xylene solution was dripped onto the host injection layer 7 and spin coated by 1000 revolutions to form a light-emitting layer 3. The light-emitting layer 3 had a thickness of 600 Å.

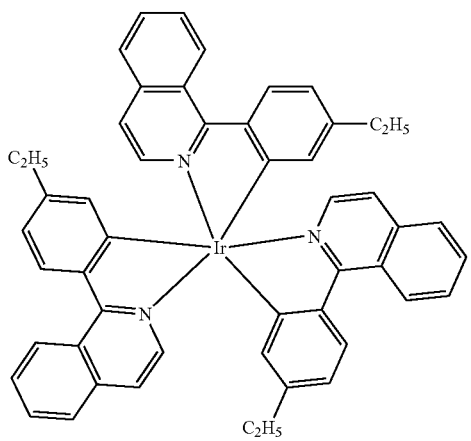

An electron injection layer 8 was then formed by vapor depositing metallic Ca. The electron injection layer 8 had a thickness of 50 nm, the degree of vacuum during vapor deposition was $3 \times 10^{-6}$ Torr, and the deposition rate of Ca was 0.5 nm/sec. A cathode 4 was then formed by vacuum vapor deposition of metallic Al. The thickness of the cathode 4 was 100 nm, the degree of vacuum during vapor deposition was $3 \times 10^{-6}$ Torr, and the deposition rate of Al was 2 Å/sec to 3 Å/sec.

The above-described process produced an organic light-emitting device.

The element obtained was operated by passing a direct current with a current density of 5 mA/cm² by using the ITO electrode as a positive electrode and the Al electrode as a negative electrode. As a result, red luminescence with a luminance of 190 cd/m² was obtained.

Example 7

An element was fabricated by the same method as in EXAMPLE 6, except that Exemplary Compound No. 123 was used as a host of the light-emitting layer instead of the Exemplary Compound No. 118. The element obtained was evaluated in the same manner as in EXAMPLE 6. The results are shown in Table 2.

Comparative Example 2

An element was fabricated by the same method as in EXAMPLE 6, except that polyfluorene (manufactured by H. W. Sands Co., molecular weight 76,000) that was a comparative compound was used as a host of the light-emitting layer instead of the Exemplary Compound No. 118. The element obtained was evaluated in the same manner as in EXAMPLE 6. The results are shown in Table 2.

TABLE 2

| | Host | Luminance at mA/cm² (cd/m²) | Emission color |
|---|---|---|---|
| EXAMPLE 6 | Exemplary compound no. 118 | 190 | Red |
| EXAMPLE 7 | Exemplary compound no. 123 | 150 | Red |
| COMPARATIVE EXAMPLE 2 | Polyfluorene | 50 | Red |

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 238094, filed Sep. 13, 2007, which is hereby incorporated by reference herein in its entirety.

What is claimed is:

1. An organic light-emitting device comprising:
an anode and a cathode, and
a layer comprising an organic compound sandwiched between the anode and the cathode, wherein
a bisfluorene compound represented by General Formula [1] below is present in the layer:

[1]

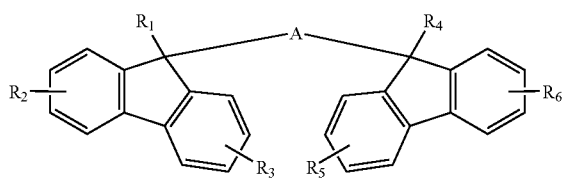

wherein in Formula [1], A is a substituted or unsubstituted alkylene group, a substituted or unsubstituted cycloalkylene group, a substituted silylene group, a substituted germylene group, an oxygen atom, and a sulfur atom, $R_1$ and $R_4$ are each a hydrogen atom, a substituted or unsubstituted alkyl group, a substituted or unsubstituted aralkyl group, a substituted or unsubstituted cycloalkyl group, a substituted or unsubstituted alkenyl group, a substituted or unsubstituted cycloalkenyl group, a substituted or unsubstituted alkoxy group, a substituted or unsubstituted aryl group, a substituted or unsubstituted aryloxy group, a substituted or unsubstituted condensed polycyclic aromatic group, a substituted or unsubstituted heterocyclic group, a substituted amino group, a substituted silyl group, a substituted germyl group, or a halogen atom and $R_2$, $R_3$, $R_5$ and $R_6$ are each a substituted or unsubstituted alkyl group, a substituted or unsubstituted aralkyl group, a substituted or unsubstituted cycloalkyl group, a substituted or unsubstituted alkenyl group, a substituted or unsubstituted cycloalkenyl group, a substituted or unsubstituted alkoxy group, a substituted or unsubstituted aryl group, a substituted or unsubstituted aryloxy group, a substituted or unsubstituted condensed polycyclic aromatic group, a substituted or unsubstituted heterocyclic group, a substituted amino group, a substituted silyl group, a substituted germyl group, or a halogen atom.

2. The light-emitting device according to claim 1, wherein the bisfluorene compound is a compound represented by General Formula [2] below,

[2]

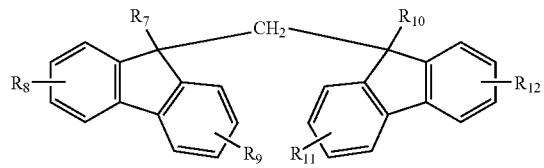

wherein in Formula [2], $R_7$ and $R_{10}$ are each a hydrogen atom, a substituted or unsubstituted alkyl group, a substituted or unsubstituted aralkyl group, a substituted or unsubstituted cycloalkyl group, a substituted or unsubstituted alkenyl group, a substituted or unsubstituted cycloalkenyl group, a substituted or unsubstituted alkoxy group, a substituted or unsubstituted aryl group, a substituted or unsubstituted aryloxy group, a substituted or unsubstituted condensed polycyclic aromatic group, a substituted or unsubstituted heterocyclic group, a substituted amino group, a substituted silyl group, a substituted germyl group, or a halogen atom and $R_8$, $R_9$, $R_{11}$ and $R_{12}$ are each a substituted or unsubstituted alkyl group, a substituted or unsubstituted aralkyl group, a substituted or unsubstituted cycloalkyl group, a substituted or unsubstituted alkenyl group, a substituted or unsubstituted cycloalkenyl group, a substituted or unsubstituted alkoxy group, a substituted or unsubstituted aryl group, a substituted or unsubstituted aryloxy group, a substituted or unsubstituted condensed polycyclic aromatic group, a substituted or unsubstituted heterocyclic group, a substituted amino group, a substituted silyl group, a substituted germyl group, or a halogen atom.

3. The light-emitting device according to claim 1, wherein the bisfluorene compound is present in a light-emitting layer.

4. The light-emitting device according to claim 3, wherein the light-emitting layer further comprises at least a fluorescent compound or a phosphorescent compound.

5. A display apparatus comprising the organic light-emitting device according to claim 1.

6. The organic light-emitting device according to claim 2, wherein the bisfluorene compound is a compound represented by any one of General Formulas [5], [7] and [9] below:

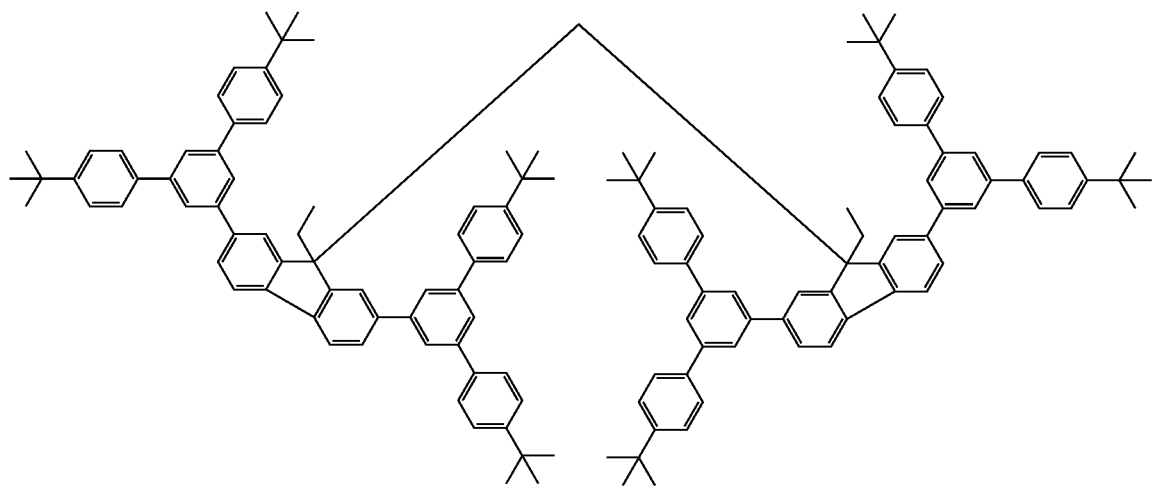

(5)

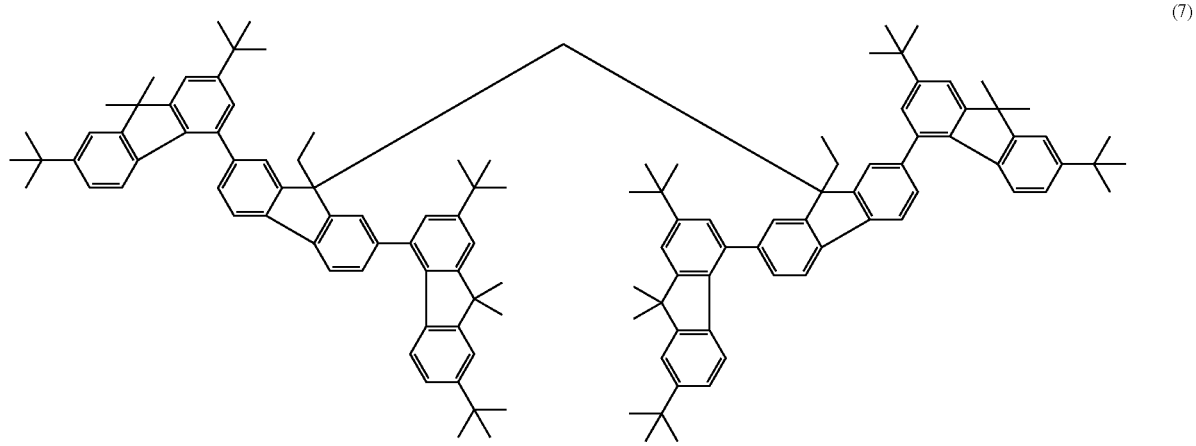

(7)

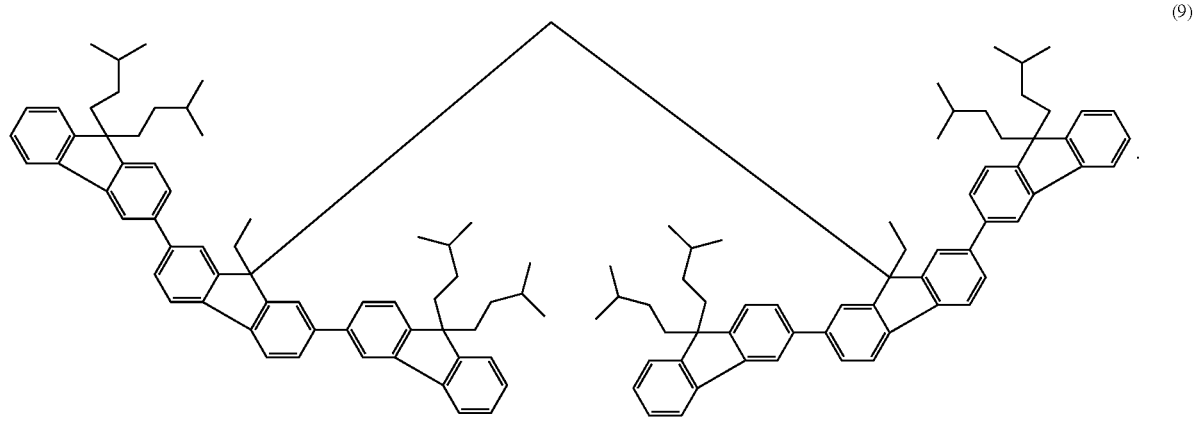

(9)

* * * * *